US006668312B2

(12) United States Patent
Aubury

(10) Patent No.: US 6,668,312 B2
(45) Date of Patent: Dec. 23, 2003

(54) SYSTEM, METHOD, AND ARTICLE OF MANUFACTURE FOR DYNAMICALLY PROFILING MEMORY TRANSFERS IN A PROGRAM

(75) Inventor: Matthew Philip Aubury, Wolvercote (GB)

(73) Assignee: Celoxica Ltd., Abingdon (GB)

( * ) Notice: Subject to any disclaimer, the term of this patent is extended or adjusted under 35 U.S.C. 154(b) by 140 days.

(21) Appl. No.: 10/026,313

(22) Filed: Dec. 21, 2001

(65) Prior Publication Data

US 2003/0120872 A1 Jun. 26, 2003

(51) Int. Cl.[7] .............................................. G06F 12/06
(52) U.S. Cl. ....................................... 711/170; 711/154
(58) Field of Search ................................ 711/154, 165, 711/167, 170

(56) References Cited

U.S. PATENT DOCUMENTS 5,987,243 A * 11/1999 Aihara .................. 395/500.38
6,477,683 B1 * 11/2002 Killian et al. .................. 716/1

* cited by examiner

*Primary Examiner*—Kevin L. Ellis
(74) *Attorney, Agent, or Firm*—Carlton Fields, P.A.

(57) ABSTRACT

A system, method and article of manufacture are provided for recording memory transfers required by an executing application. A memory of a system hosting an application is divided into micropages (small ranges of memory). A memory map of the application is maintained. The map records which functions have valid copies of micropages. The map is checked to determine which functions have a valid copy of the data when a current function reads for a micropage. A transfer of the data from another function to the current function is recorded if the current function does not have a valid copy of the data. The map is updated to reflect that the current function has a valid copy of the micropage if the data is transferred from another function. A write to a micropage is recorded. The map is updated to reflect that the current function has the only valid copy of a micropage when a write to the micropage occurs. A report of data transfers among the functions is output.

18 Claims, 20 Drawing Sheets

SYSTEM, METHOD, AND ARTICLE OF MANUFACTURE FOR DYNAMICALLY PROFILING MEMORY TRANSFERS IN A PROGRAM

FIELD OF THE INVENTION

The present invention relates to a system for designing and producing an electronic circuit having a desired functionality and comprising both hardware which is dedicated to execution of certain of the functionality and software-controlled machines for executing the remainder of the functionality under the control of suitable software.

BACKGROUND OF THE INVENTION

It is well known that software-controlled machines provide great flexibility in that they can be adapted to many different desired purposes by the use of suitable software. As well as being used in the familiar general purpose computers, software-controlled processors are now used in many products such as cars, telephones and other domestic products, where they are known as embedded systems.

However, for a given a function, a software-controlled processor is usually slower than hardware dedicated to that function. A way of overcoming this problem is to use a special software-controlled processor such as a RISC processor which can be made to function more quickly for limited purposes by having its parameters (for instance size, instruction set etc.) tailored to the desired functionality.

Where hardware is used, though, although it increases the speed of operation, it lacks flexibility and, for instance, although it may be suitable for the task for which it was designed it may not be suitable for a modified version of that task which is desired later. It is now possible to form the hardware on reconfigurable logic circuits, such as Field Programmable Gate Arrays (FPGA's) which are logic circuits which can be repeatedly reconfigured in different ways. Thus they provide the speed advantages of dedicated hardware, with some degree of flexibility for later updating or multiple functionality.

In general, though, it can be seen that designers face a problem in finding the right balance between speed and generality. They can build versatile chips which will be software controlled and thus perform many different functions relatively slowly, or they can devise application-specific chips that do only a limited set of tasks but do them much more quickly.

A compromise solution to these problems can be found in systems which combine both dedicated hardware and also software. The hardware is dedicated to particular functions, e.g. those requiring speed, and the software can perform the remaining functions. The design of such systems is known as hardware-software codesign.

Within the design process, the designer must decide, for a target system with a desired functionality, which functions are to be performed in hardware and which in software. This is known as partitioning the design. Although such systems can be highly effective, the designer must be familiar with both software and hardware design. It would be advantageous if such systems could be designed by people who have familiarity only with software and which could utilize the flexibility of configurable logic resources.

SUMMARY OF THE INVENTION

A system, method and article of manufacture are provided for recording memory transfers required by an executing application. A memory of a system hosting an application is divided into micropages (small ranges of memory). A memory map of the application is maintained. The map records which functions (or groups of functions) have valid copies of micropages. The map is checked to determine which functions have a valid copy of the data when a current function reads for a micropage. Nothing is recorded if the current function has a valid copy of the data. A transfer of the data from another function to the current function is recorded if the current function does not have a valid copy of the data. The map is updated to reflect that the current function has a valid copy of the micropage if the data is transferred from another function. A write to a micropage is recorded. The map is updated to reflect that the current function has the only valid copy of a micropage when a write to the micropage occurs. A report of data transfers among the functions is output.

In one aspect of the present invention, the data is taken as coming from an external source function if no function has a valid copy of the data. The report can be a 2-dimensional table recording data transfers among the functions.

Preferably, an ownership of the micropage is represented by a bitmask, where each bit represents a possible ownership domain. The functions of the application can be partitioned into domains representing hardware and software domains of a target system. Also preferably, external libraries are supported.

DETAILED DESCRIPTION

Figure 1:
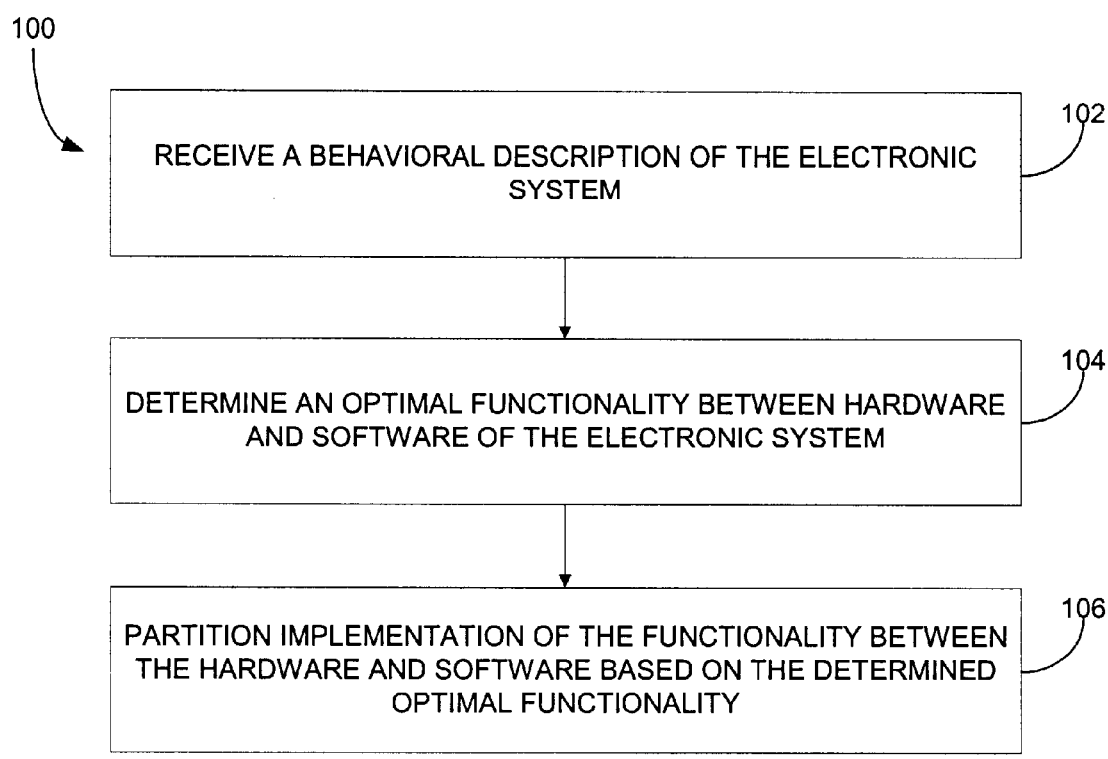
FIG. 1 is a flow diagram of a process for automatically partitioning a behavioral description of an electronic system into the optimal configuration of hardware and software according to a preferred embodiment of the present invention.

The present invention provides a hardware/software codesign system which can target a system in which the hardware or the processors to run the software can be customized according to the functions partitioned to it. Thus rather than the processor or hardware being fixed (which effectively decides the partitioning), the codesign system of this invention includes a partitioning means which flexibly decides the partitioning while varying the parameters of the hardware or processor to obtain both an optimal partitioning and optimal size of hardware and processor.

In more detail it provides a codesign system for producing a target system having resources to provide specified functionality by:

(a) operation of dedicated hardware; and (b) complementary execution of software on software-controlled machines;

The codesign system comprising means for receiving a specification of the functionality, partitioning means for partitioning implementation of the functionality between (a) and (b) and for customizing the hardware and/or the machine in accordance with the selected partitioning of the functionality.

Thus the target system is a hybrid hardware/software system. It can be formed using configurable logic resources in which case either the hardware or the processor, or both, can be formed on the configurable logic resources (e.g. an FPGA).

In one embodiment of the invention the partitioning means uses a genetic algorithm to optimize the partitioning and the parameters of the hardware and the processor. Thus, it generates a plurality of different partitions of the functionality of the target system (varying the size of the hardware and/or the processor between the different partitions) and estimates the speed and size of the resulting system. It then selects the optimal partitioning on the basis of the estimates. In the use of a genetic algorithm, a variety of partitions are randomly generated, the poor ones are rejected, and the remaining ones are modified by combining aspects of them with each other to produce different partitions. The speed and size of these are then assessed and the process can be repeated until an optimal partition is produced.

The invention is applicable to target systems which use either customizable hardware and a customizable processor, or a fixed processor and customizable hardware, or fixed hardware and a customizable processor. Thus the customizable part could be formed on an FPGA, or, for instance, an ASIC. The system may include estimators for estimating the speed and size of the hardware and the software controlled machine and may also include an interface generator for generating interfaces between the hardware and software. In that case the system may also include an estimator for estimating the size of the interface. The partitioning means calls the estimators when deciding on an optimum partitioning.

The software-controlled machine can comprise a CPU and the codesign system comprises means for generating a compiler for the CPU as well as means for describing the CPU where it is to be formed on customizable logic circuits.

The codesign system can further comprise a hardware compiler for producing from those parts of the specification partitioned to hardware a register transfer level description for configuring configurable logic resources (such as an FPGA). It can further include a synthesizer for converting the register transfer level description into a net list.

The system can include a width adjuster for setting and using a desired data word size, and this can be done at several points in the desired process as necessary.

Another aspect of the invention provides a hardware/software codesign system which receives a specification of a target system in the form of behavioral description, i.e. a description in a programming language such as can be written by a computer programmer, and partitions it and compiles it to produce hardware and software.

The partitioning means can include a parser for parsing the input behavioral description. The description can be in a familiar computer language such as C, supplemented by a plurality of predefined attributes to describe, for instance, parallel execution of processes, an obligatory partition to software or an obligatory partition to hardware. The system is preferably adapted to receive a declaration of the properties of at least one of the hardware and the software-controlled machine, preferably in an object-oriented paradigm. It can also be adapted such that some parts of the description can be at the register transfer level, to allow closer control by the user of the final performance of the target system.

Thus, in summary, the invention provides a hardware/software codesign system for making an electronic circuit which includes both dedicated hardware and software controlled resources. The codesign system receives a behavioral description of the target electronic system and automatically partitions the required functionality between hardware and software, while being able to vary the parameters (e.g. size or power) of the hardware and/or software. Thus, for instance, the hardware and the processor for the software can be formed on an FPGA, each being no bigger than is necessary to form the desired functions. The codesign system outputs a description of the required processor (which can be in the form of a net list for placement on the FPGA), machine code to run on the processor, and a net list or register transfer level description of the necessary hardware. It is possible for the user to write some parts of the description of the target system at register transfer level to give closer control over the operation of the target system, and the user can specify the processor or processors to be used, and can change, for instance, the partitioner, compilers or speed estimators used in the codesign system. The automatic partitioning can be performed by using an optimization algorithm, e.g. a genetic algorithm, which generates a partitioning based on estimates of performance.

The invention also allows the manual partition of systems across a number of hardware and software resources from a single behavioral description of the system. This provision for manual partitioning, as well as automatic partitioning, gives the system great flexibility.

The hardware resources may be a block that can implement random hardware, such as an FPGA or ASIC; a fixed processor, such as a microcontroller, DSP, processor, or processor core; or a customizable processor which is to be implemented on one of the hardware resources, such as an FPGA-based processor. The system description can be augmented with register transfer level descriptions, and parameterized instantiations of both hardware and software library components written in other languages.

The sort of target systems which can be produced include:
a fixed processor or processor core, coupled with custom hardware;
a set of customizable (e.g. FPGA-based) processors and custom hardware;
a system on a chip containing fixed processors and an FPGA; and
a PC containing an FPGA accelerator board.

The use of the advanced estimation techniques in specific embodiments of the invention allows the system to take into account the area of the processor that will be produced, allowing the targeting of customizable processors with additional and removable instructions, for example. The estimators also take into account the speed degradation produced when the logic that a fixed hardware resource must implement nears the resource's size limit. This is done by the estimator reducing the estimated speed as that limit is reached. Further, the estimators can operate on both the design before partitioning, and after partitioning. Thus high level simulation, as well as simulation and estimation after partitioning, can be performed.

Where the system is based on object oriented design, this allows the user to add new processors quickly and to easily define their compilers.

The part of the system which compiles the software can transparently support additional or absent instructions for the processor and so is compatible with the parameterization of the processor.

Preferably, the input language supports variables with arbitrary widths, which are then unified to a fixed width using a promotion scheme, and then mapped to the widths available on the target system architecture.

Further in one embodiment of the invention it is possible for the input description to include both behavioral and register transfer level descriptions, which can both be compiled to software. This gives support for very fast simulation and allows the user control of the behavior of the hardware on each clock cycle.

FIG. 1 is a flow diagram of a process 100 for automatically partitioning a behavioral description of an electronic system into the optimal configuration of hardware and software according to a preferred embodiment of the present invention. In operation 102, the system receives a behavioral description of the electronic system and, in operation 104, determines the optimal required functionality between hardware and software. In operation 106, that functionality is partitioned preferably while varying the parameters (e.g. size or power) of the hardware and/or software. Thus, for instance, the hardware and the processors for the software can be formed on a reconfigurable logic device, each being no bigger than is necessary to form the desired functions.

The codesign system outputs a description of the required processors, machine code to run on the processors, and a net list or register transfer level description of the necessary hardware. It is possible for the user to write some parts of the description of the system at register transfer level to give closer control over the operation of the system, and the user can specify the processor or processors to be used, and can change, for instance, the partitioner, compilers or speed estimators used in the codesign system. The automatic partitioning is formed by using a genetic algorithm which estimates the performance of randomly generated different partitions and selects an optimal one of them.

Figure 2:
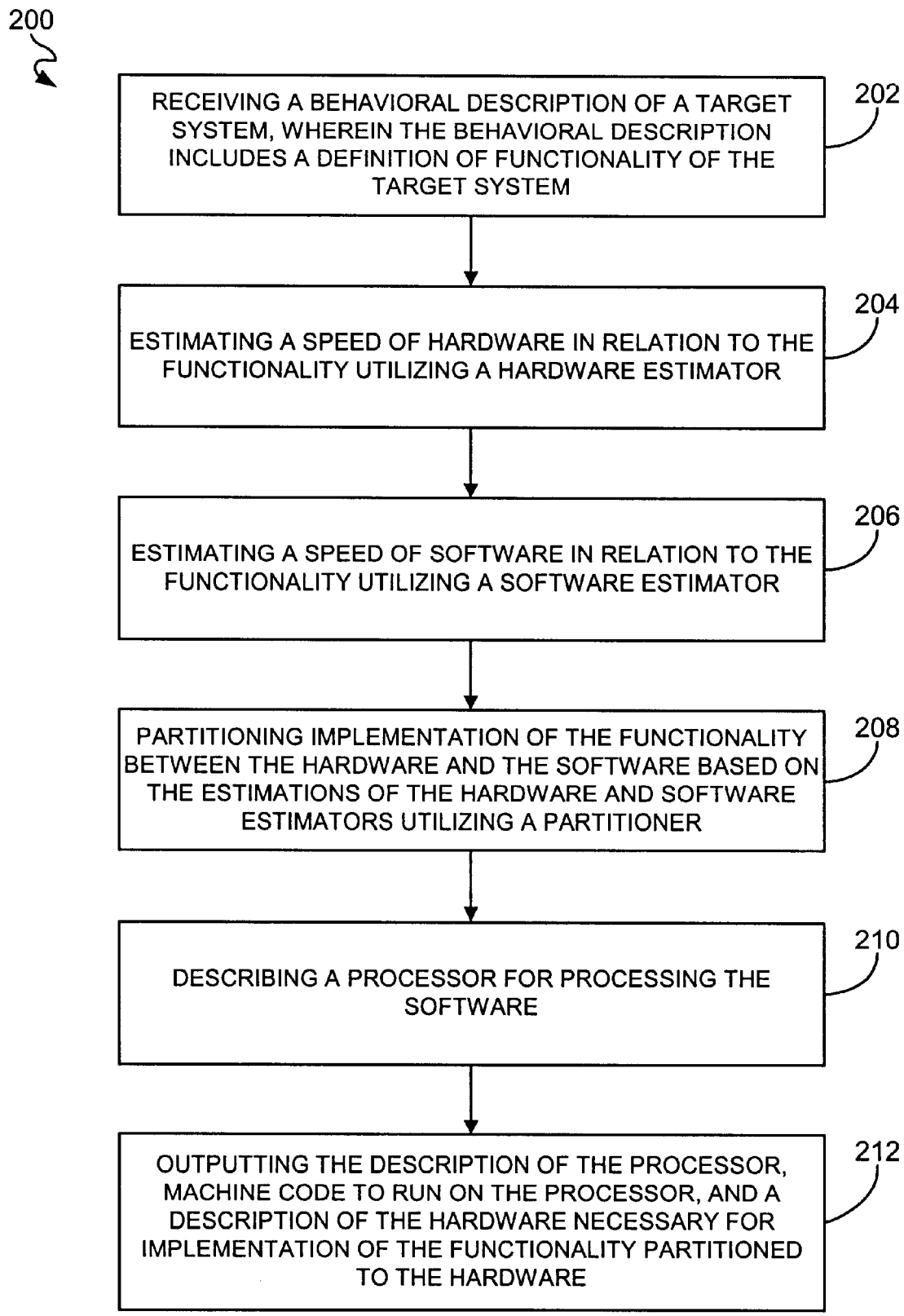
FIG. 2 is a flowchart of a process for partitioning functionality between hardware and software in accordance with an embodiment of the present invention.

FIG. 2 is a flowchart of a process 200 for partitioning functionality between hardware and software in accordance with an embodiment of the present invention. A behavioral description of a target system is received that includes a definition of functionality of the target system in operation 202. A speed of hardware in relation to the functionality is estimated utilizing a hardware estimator in operation 204 and a speed of software in relation to the functionality is estimated utilizing a software estimator in operation 206. Implementation of the functionality between the hardware and the software is partitioned based on the estimations of the hardware and software estimators utilizing a partitioner in operation 208. A processor for processing the software is described in operation 210. The description of the processor, machine code to run on the processor, and a description of the hardware necessary for implementation of the functionality partitioned to the hardware are outputted in operation 212.

In one embodiment of the present invention, a size of the hardware and the processor in configurable logic may be estimated utilizing a size estimator. In such an embodiment, the partitioner may also partition implementation of the functionality based on the estimations of the hardware estimator, software estimator, and size estimator. In another embodiment, the target system may be simulated utilizing a simulator. In such an embodiment, the partitioner may partition implementation of the functionality based at least in part on a simulation of the simulator. In a further embodiment, a Register Transfer Level (RTL) description may be generated utilizing a behavioral synthesizer. As an option in such an embodiment, the RTL description may also be mapped to a predetermined type of technology utilizing an RTL synthesizer. In an aspect of the present invention, the processor description may be parameterized.

Figure 3:
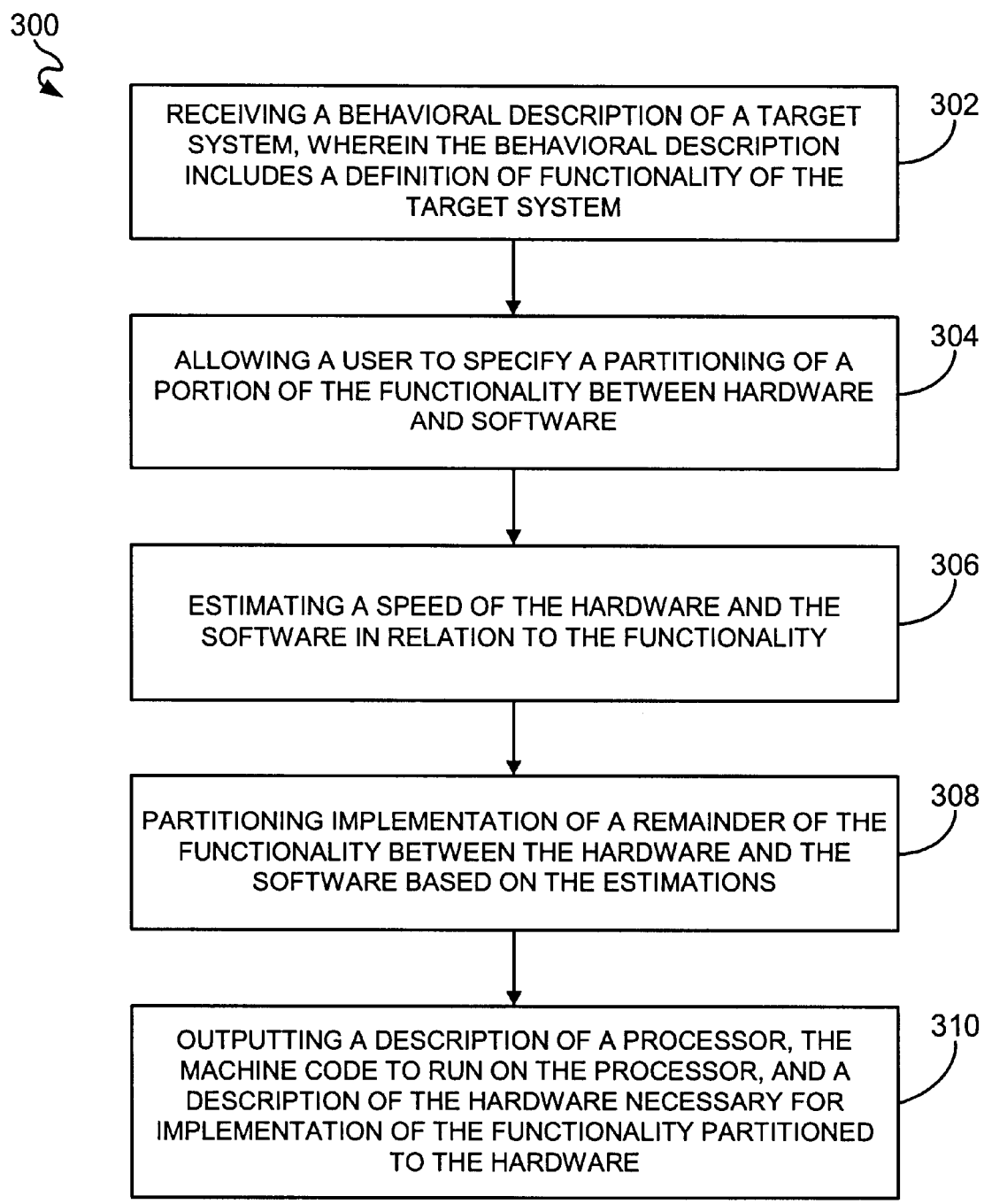
FIG. 3 is a flowchart of a process for manual partitioning of functionality between multiple hardware and software resources in accordance with an embodiment of the present invention.

FIG. 3 is a flowchart of a process 300 for manual partitioning of functionality between multiple hardware and software resources in accordance with an embodiment of the present invention. A behavioral description of a target system is received in operation 302 that includes a definition of functionality of the target system. A user is then allowed to specify a partitioning of a portion of the functionality between hardware and software in operation 304. A speed of the hardware and the software is estimated in relation to the functionality in operation 306 so that implementation of a remainder of the functionality is partitioned between the hardware and the software based on the estimations in operation 308. Additionally, a description of a processor, the machine code to run on the processor, and a description of the hardware necessary for implementation of the functionality partitioned to the hardware is outputted in operation 310.

In one embodiment of present invention, a system implementing the processor, machine code, and hardware may also be simulated so that the partitioning of the implementation of the remainder of the functionality may be based at least in part on the simulation. In one aspect of the present invention, an attribute may be added to input code for identifying which portion of the functionality is to be put in software. In such an aspect, the attribute may further specify a target processor for processing the software implementing the portion of functionality. In another aspect, the user specification may define a cycle-by-cycle behavior of the hardware specified by the user. In a further aspect, the hardware may be implemented in configurable logic.

This description will later refer to specific examples of the input behavioral or register transfer level description of examples of target systems. These examples are reproduced in Appendices, namely:

Appendix 1 is an exemplary register transfer level description of a simple processor.

Figure 10:
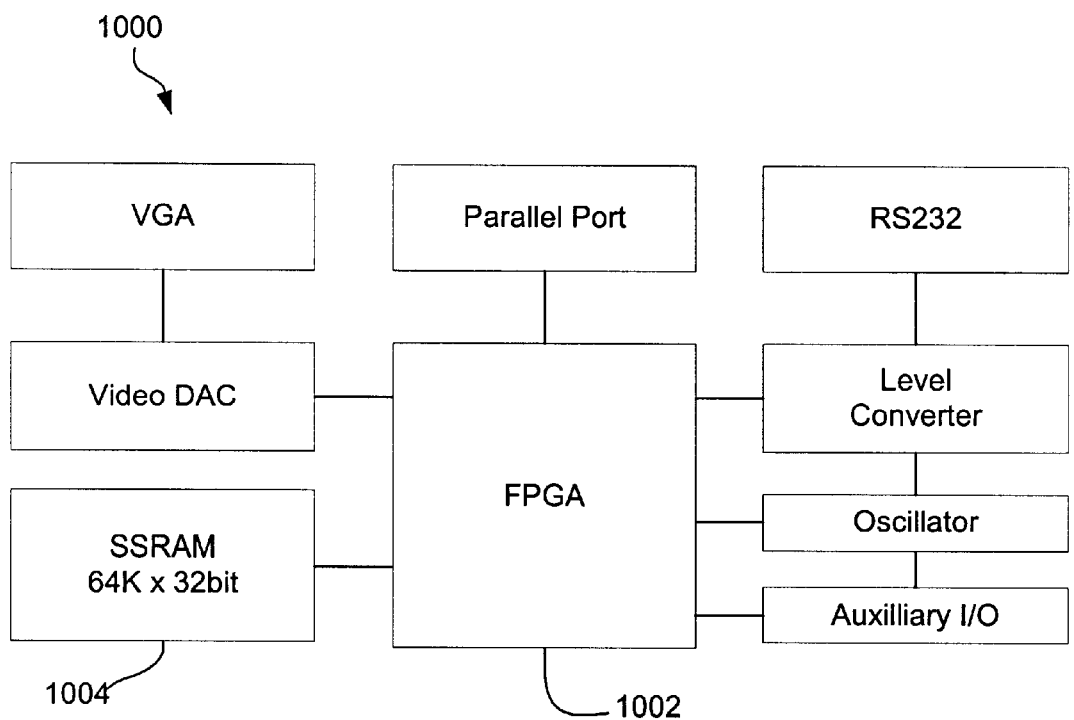
FIG. 10 is a block diagram of the platform used to implement the second example circuit produced by an embodiment of the invention.
Figure 11:
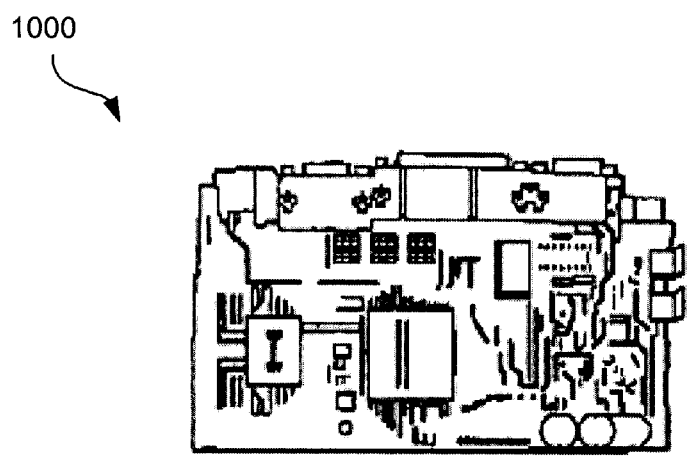
FIG. 11 is a picture of the circuit of FIG. 10.
Figure 12:
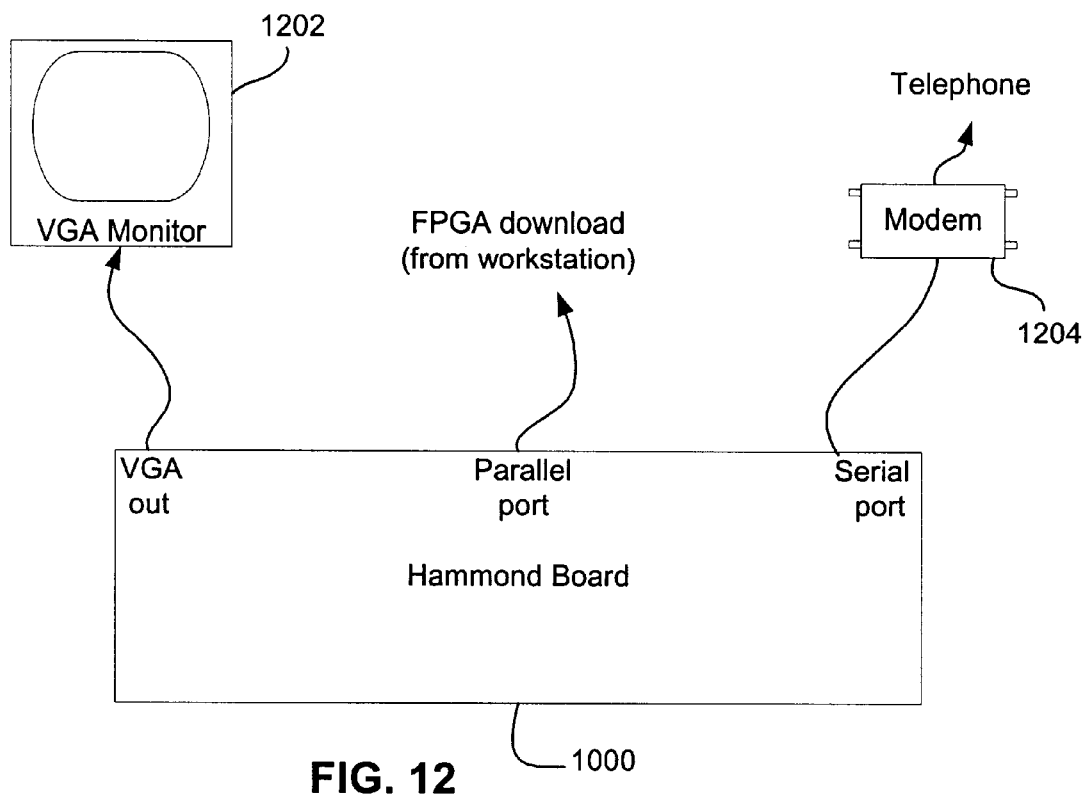
FIG. 12 is a block diagram of the system of FIG. 10.

Appendix 2 is a register transfer level description of the main process flow in the example of FIGS. 10 to 12.

Figure 14:
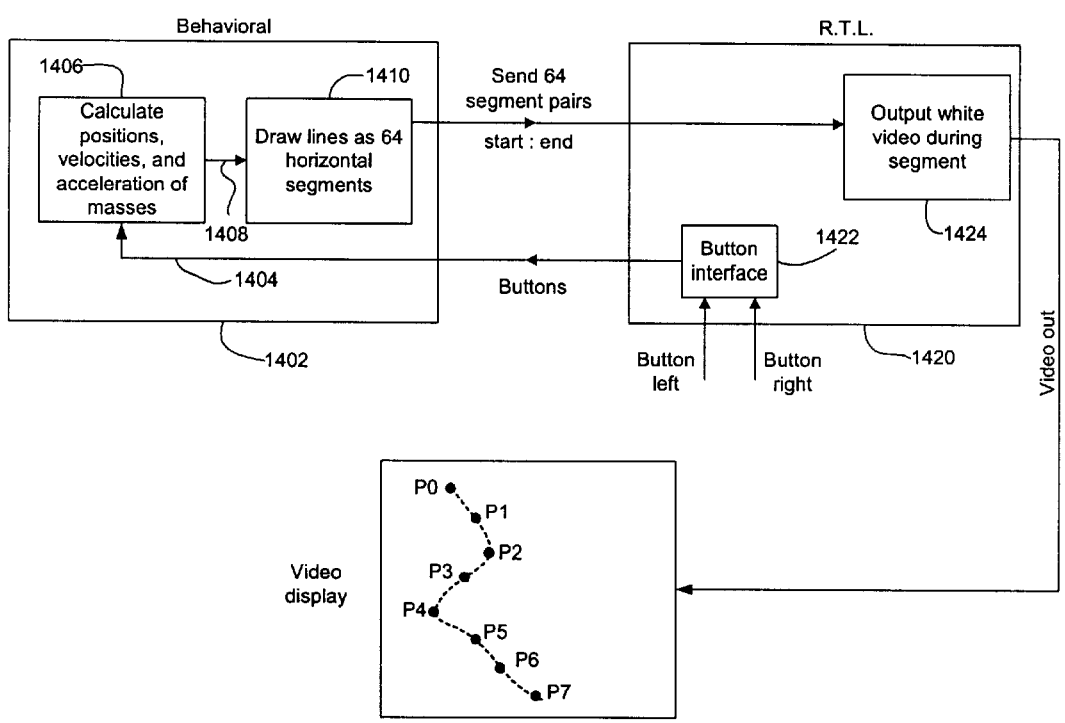
FIG. 14 is a block diagram of a third example target system.

Appendix 3 is the input specification for the target system of FIG. 14.

Figure 4:
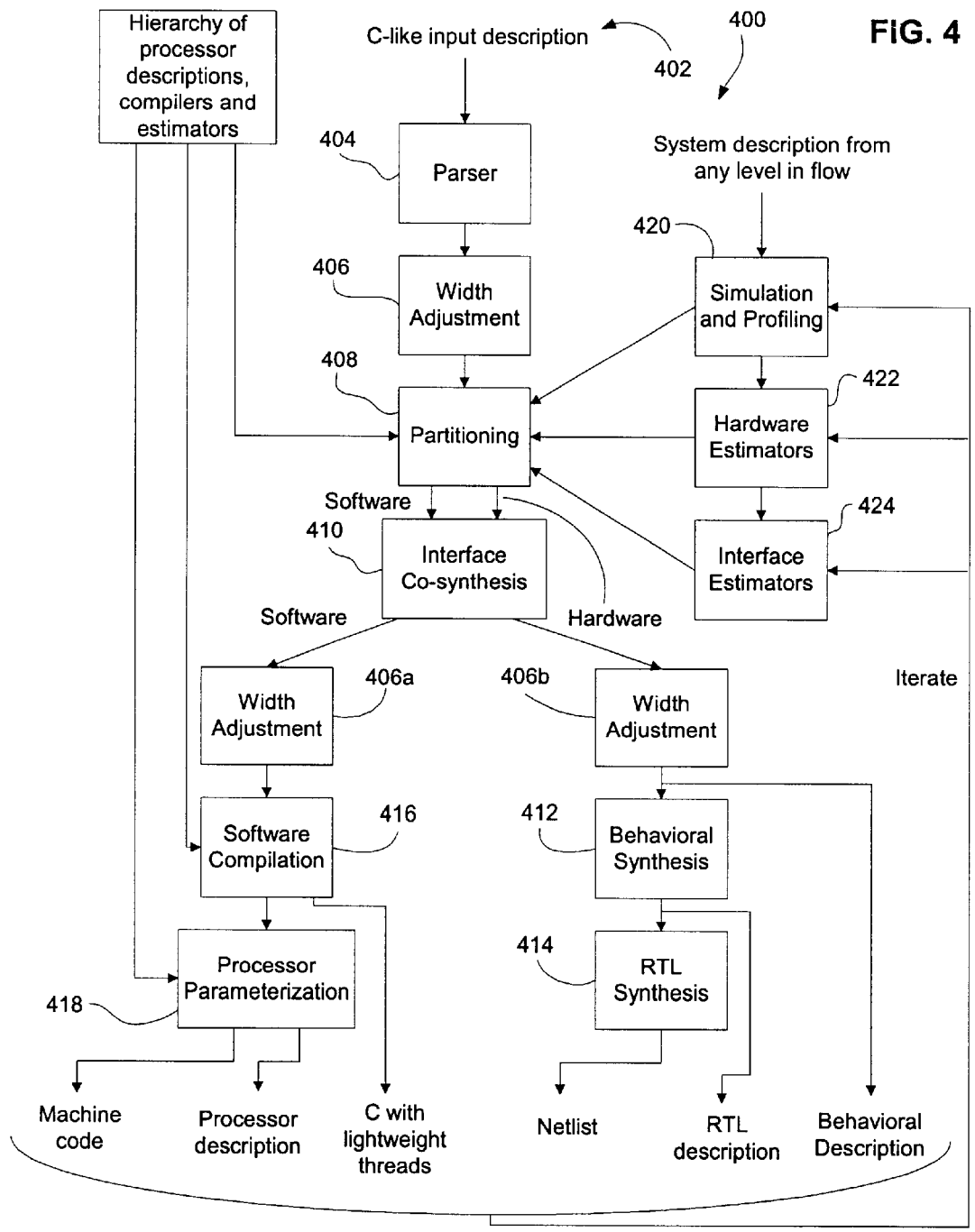
FIG. 4 is a flow diagram schematically showing the codesign system of one embodiment of the invention.

The flow of the codesign process in an embodiment of the invention is shown in FIG. 4 and will be described below. The target architecture for this system is an FPGA containing one or more processors, and custom hardware. The processors may be of different architectures, and may communicate with each other and with the custom hardware.

The Input Language

In this embodiment the user writes a description 402 of the system in a C-like language, which can be ANSI C with some additions which allow efficient translation to hardware and parallel processes. This input description will be compiled by the system 400 of FIG. 4. The additions to the ANSI C language include the following:

Variables are declared with explicit bit widths and the operators working on the variables work with an arbitrary precision. This allows efficient implementation in hardware. For instance a statement which declares the width of variables (in this case the program counter pc, the instruction register ir, and the top of stack tos) is as follows:

unsigned 12 pc, ir, tos

The width of the data path of the processor in the target system may be declared, or else is calculated by the partitioner 408 as the width of the widest variable which it uses.

The "par" statement has been added to describe process-level parallelism. The system can automatically extract fine-grained parallelism from the C-like description but generating coarse-grained parallelism automatically is far more difficult. Consequently the invention provides this attribute to allow the user to express parallelism in the input language using the "par" statement which specifies that a following list of statements is to be executed in parallel. For example, the expression:

Par {parallel_port(port); SyncGeno; } means that two sub-routines, the first of which is a driver for a parallel port and the second of which is a sync generator for a video display are to be executed in parallel. All parts of the system will react to this appropriately.

Channels can be declared and are used for blocking, point-to-point synchronized communication as used in occam (see G. Jones. Programming in occam. Prentice Hall International Series in Computer Science, 1987., which is hereby incorporated by reference) with a syntax like a C function call. The parallel processes can use the channels to perform distributed assignment. Thus parallel processes can communicate using blocking channel communication. The keyword "chan" I declares these channels. For example, chan hwswchan; i I declares a channel along which variables will be sent and received between the hardware and software parts of the system. Further, send (channel 1, a)

is a statement which sends the value of variable a down channel 1; and receive (channel 2, b) is a statement which assigns the value received along channel 2 to variable b.

The hardware resources available are declared. The resources may be a customizable processor, a fixed processor, or custom hardware. The custom hardware may be of a specific architecture, such as a Xilinx FPGA. Further, the architecture of the target system can be described in terms of the available functional units and their interconnection.

To define the architecture "platforms" and "channels" are defined. A platform can be hard or soft. A hard platform is something that is fixed such as a Pentium processor or an FPGA. A soft platform is something that can be configured like an FPGA-based processor. The partitioner 408 understands the keywords "hard" and "soft", which are used for declaring these platforms and the code can be implemented on any of these.

This particular embodiment supports the following hard platforms:

Xilinx 4000 series FPGAs (e.g. the Xilinx 4085 below);
Xilinx Virtex series FPGAs;
Altera Flex and APEX PLDs;
Processor architectures supported by ANSI C compilers;

and the following soft platforms each of which is associated with one of the parameterizable processors mentioned later:

FPGAStackProc, FPGAParallelStackProc, FPGAMips.

An attribute can be attached to a platform when it is declared:

platform (PLATFORMS) y t c

For a hard platform the attribute PLATFORMS contains one element: the architecture of the hard platform. In this embodiment this may be the name of a Xilinx 3000 or 4000 series FPGA, an Altera FPGA, or an x86 processor.

For a soft platform, PLATFORMS is a pair. The first element is the architecture of the platform:

FPGAStackProc, FPGAParallelStackProc or FPGAMips and the second is the name of the previously declared platform on which the new platform is implemented.

Channels can be declared with an implementation, and as only being able to link previously declared platforms. The system 400 recognizes the following channel implementations:

PCIBus—a channel implemented over a PCI bus between an FPGA card and a PC host.

FPGAChan—a channel implemented using wires on the FPGA.

The following are the attributes which can be attached to a channel when it is declared:

type (CHANNELTYPE)

This declares the implementation of the channel. Currently CHANNELTYPE may be PCIBus or FPGAChan. FPGAChan is the default.

from(PLATFORM)

PLATFORM is the name of the platform which can send down the channel.

to(PLATFORM)

PLATFORM is the name of the platform which can receive from the channel.

The system 400 checks that the declared channels and the platforms that use them are compatible. The communication mechanisms which a given type of channel can implement are built into the system. New mechanisms can be added by the user, in a similar way to adding new processors as will be explained below.

Now an example of an architecture will be given.

Example Architecture

```
/* Architectural Declarations */
// the 4085 is a hard platform -- call this one meetea board hard meeteaBoard -attribute_((platform(Xilinx4085)));
// the pentium is a hard platform -- call this one hostProcessor hard hostProcessor
attribute- ((platform(Pentium)));
// proci is a soft platform which is implemented
// on the FPGA on the meetea board
soft proci     attribute- ((platform(FpgaStackProc, meeteaBoard)));
```

Example Program

```
void main()
    {
        // channel1 is implemented on a PCIBus
                I
        // and can send data from hostProcessor to meetea board
        chan channel1 attribute- ((type(PCIBus), from(hostProcessor),
            to(meeteaBoard)));
// channel2 is implemented on the FPGA
chan channel2, attribute- ((type(FPGAChan)));
/* the code */
    par {
        // code which can be assigned to
        // either hostProcessor (software).
        // or prod (software or reconfigurable processor),
        // or meetea board (hardware),
        //or left unassigned (compiler decides).
        // Connections between hostProcessor
        // and prod or meetea must be over the PCI Bus
        // (channel1)
        // Connections between procl and hardware
        // must be over the FPGA channel (channel2)
```

Attributes are also added to the input code to enable the user to specify whether a block is to be put in hardware or software and for software the attribute also specifies the target processor. The attribute is the name of the target platform. For example:

```
{
    int a, b;
    a = a +b;
}        attribute- ((platform(hostProcessor)))
``` assigns the operation a+b to Host Processor.

For hardware the attribute also specifies whether the description is to be interpreted as a register transfer (RT) or behavioral level description. The default is behavioral. For example:

```
{
    int a, b;
    par {
        b = a + b;
        a b,
    }
} ,attribute-((platform(meeteaBoard),level(RTL)))
``` would be compiled to hardware using the RTL compiler, which would guarantee that the two assignments happened on the same clock cycle.

Thus parts of the description which are to be allocated to hardware can be written by the user at a register transfer level, by using a version of the input language with a well defined timing semantics (for example Handel-C or another RTL language), or the scheduling decisions (i.e. which operations happen on which clock cycle) can be left to the compiler. Thus using these attributes a block of code may be specifically assigned by the user to one of the available resources. Soft resources may themselves be assigned to hardware resources such as an FPGA-based processor. The following are the attributes which can be attached to a block of code:

platform(PLATFORM)
        PLATFORM is the name of the platform on which the code will be implemented. This implies the compiler which will be used to compile that code.

level(LEVEL)
        LEVEL is Behavioral or RTL. Behavioral descriptions will be scheduled and may be partitioned. RTL descriptions are passed straight through to the RTL synthesizer e.g. a Handel-C compiler.

cycles(NUMBER)
        NUMBER is a positive integer. Behavioral descriptions will be scheduled in such a way that the block of code will execute within that number of cycles, when possible. An error is generated if it is not possible.

Thus the use of this input language which is based on a known computer language, in this case C, but with the additions above allows the user, who could be a system programmer, to write a specification for the system in familiar behavioral terms like a computer program. The user only needs to learn the additions above, such as how to declare parallelism and to declare the available resources to be able to write the input description of the target system.

This input language is input to the parser 404 which parses and type checks the input code, and performs some syntax level optimizations, (in a standard way for parsers), and attaches a specific compiler to each block of code based on the attributes above. The parser 404 uses standard techniques [Aho, Sethi and Ullman; "Compilers Principles, Techniques, and Tools"; Addison Wesley known as "The Dragon Book", which is hereby incorporated by reference] to turn the system description in the input language into an internal data structure, the abstract syntax tree which can be supplied to the partitioner 408.

The width adjuster 406 uses C-techniques to promote automatically the arguments of operators to wider widths such that they are all of the same width for instance by concatenating them with zeros. Thus this is an extension of the promotion scheme of the C language, but uses arbitrary numbers of bits. Further adjustment is carried out later in the flow at 406*a* and 406*b,* for instance by ANDing them with a bit mask. Each resource has a list of widths that it can support. For example a 32 bit processor may be able to carry out 8, 16 and 32 bit operations. Hardware may be able to support any width, or a fixed width datapath operator may have been instantiated from a library. The later width adjustment modules 406a and 406b insert commands to enable the width of operation in the description to be implemented correctly using the resources available.

Hardware/Software Partitioning

The partitioner 408 generates a control/data-flow graph (CDFG) from the abstract syntax tree, for instance using the techniques described in G. de Michelli "Synthesis and Optimization of Digital Circuits"; McGraw-Hill, 1994 which is hereby incorporated by reference. It then operates on the parts of the description which have not already been assigned to resources by the user. It groups parts of the description together into blocks, "partitioning blocks", which are indivisible by the partitioner. The size of these blocks is set by the user, and can be any size between a single operator, and a top-level process. Small blocks tend to lead to a slow more optimal partition; large blocks tend to lead to a faster less optimal partition.

The algorithm used in this embodiment is described below but the system is designed so that new partitioning algorithms can easily be added, and the user can choose which of these partitioning algorithms to use. The algorithms all assign each partitioning block to one of the hardware resources which has been declared.

The algorithms do this assignment so that the total estimated hardware area is smaller than the hardware resources available, and so that the estimated speed of the system is maximized.

The algorithm implemented in this embodiment of the system is a genetic algorithm for instance as explained in D. E. Goldberg, "Genetic Algorithms in Search, Optimization and Machine learning", Addison-Wesley, 1989 which is hereby incorporated by reference. The resource on which each partitioning block is to be placed represents a gene and the fitness function returns infinity for a partitioning which the estimators say will not fit in the available hardware; otherwise it returns the estimated system speed. Different partitions are generated and estimated speed found. The user may set the termination condition to one of the following:

1) when the estimated system speed meets a given constraint;
2) when the result converges, i.e. the algorithm has not resulted in improvement after a user-specified number of iterations;
3) when the user terminates the optimization manually.

The partitioner 408 uses estimators 420, 422, and 424 to estimate the size and speed of the hardware, software and interfaces as described below.

It should be noted from FIG. 2 that the estimators and the simulation and profiling module 420 can accept a system description from any level in the flow. Thus it is possible for the input description, which may include behavioral and register transfer level parts, to be compiled to software for simulation and estimation at this stage. Further, the simulator can be used to collect profiling information for sets of typical input data, which will be used by the partitioner 408 to estimate data dependent values, by inserting data gathering operations into the output code.

Hardware Estimation

The estimator 422 is called by the partitioner 408 for a quick estimation of the size and speed of the hardware parts of the system using each partition being considered. Data dependent values are estimated using the average of the values for the sets of typical input data supplied by the user.

To estimate the speed of hardware, the description is scheduled using a call to the behavioral synthesizer 412. The user can choose which estimation algorithm to use, which gives a choice between slow accurate estimation and faster less accurate estimation. The speed and area of the resulting RTL level description is then estimated using standard techniques. For FPGAs the estimate of the speed is then decreased by a non-linear factor determined from the available free area, to take into account the slower speed of FPGA designs when the FPGA is nearly full.

Software Estimation

If the software is to be implemented on a fixed processor, then its speed is estimated using the techniques described in J. Madsen and J. Grode and P. V. Knudsen and M. E. Petersen and A. I-Iaxthausen, "LYCOS: the Lyngby Co-Synthesis System, Design Automation of Embedded Systems, 1977, volume 2, number 2, (Madsen et al) which is hereby incorporated by reference. The area of software to be implemented on a fixed processor is zero.

If the target is customizable processors to be compiled by the system itself then a more accurate estimation of the software speed is used which models the optimizations that the software compiler 416 uses. The area and cycle time of the processor is modeled using a function which is written for each processor, and expresses the required values in terms of the values of the processor's parameterizations, such as the set of instructions that will be used, the data path and instruction register width and the cache size.

Interface Synthesis and Estimation

Interfaces between the hardware and software are instantiated by the interface cosynthesizer 410 from a standard library of available communication mechanisms. Each communication mechanism is associated with an estimation function, which is used by the partitioner to cost the software and hardware speed and area required for given communication, or set of communications. Interfaces which are to be implemented using a resource which can be parameterized (such as a channel on an FPGA), are synthesized using the parameterizations decided by the partitioner. For example, if a transfer of ten thousand 32 bit values over a PCI bus was required, a DMA transfer from the host to an FPGA card's local memory might be used.

Compilation

Figure 5:
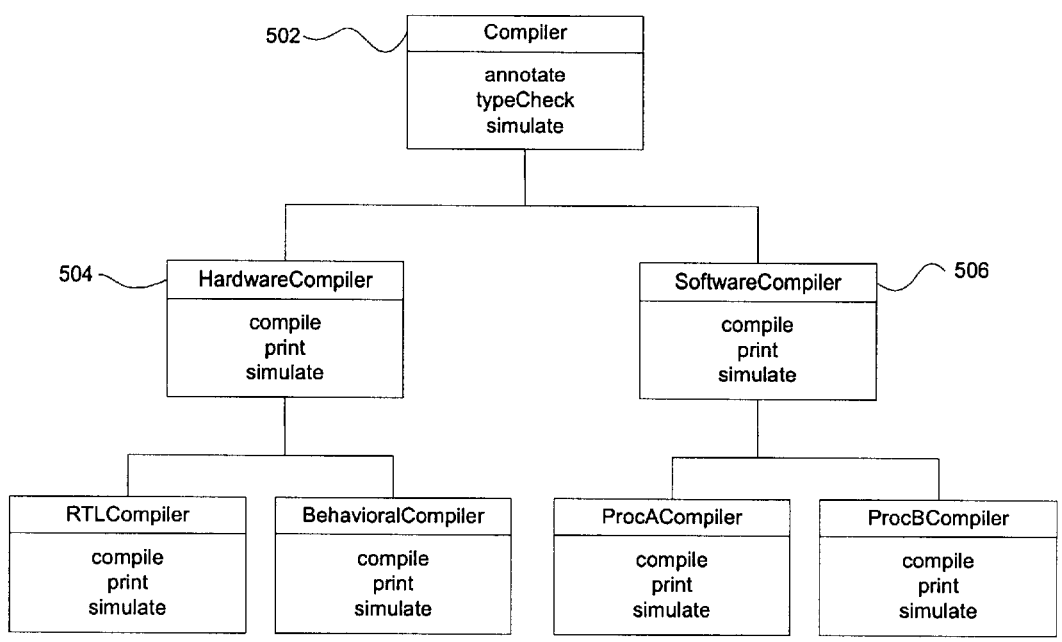
FIG. 5 illustrates the compiler objects which can be defined in one embodiment of the invention.

The compiler parts of the system are designed in an object oriented way, and actually provide a class hierarchy of compilers, as shown in FIG. 5. Each node in the tree shows a class which is a subclass of its parent node. The top-level compiler class 502 provides methods common to both the hardware and software flows, such as the type checking, and a system-level simulator used for compiling and simulating the high-level description. These methods are inherited by the hardware and software compilers 504, 506, and may be used or overridden. The compiler class also specifies other, virtual, functions which must be supplied by its subclasses. So the compile method on the hardware compiler class compiles the description to hardware by converting the input description to an RTL description; the compile method on the Processor A compiler compiles a description to machine code which can run on Processor A.

There are two ways in which a specific compiler can be attached to a specific block of code:

A) In command line mode. The compiler is called from the command line by the attributes mentioned above specifying which compiler to use for a block of code.
B) Interactively. An interactive environment is provided, where the user has access to a set of functions which the user can call, e.g. to estimate speed and size of hardware and software implementations, manually attach a compiler to a block of code, and call the simulator. This interactive environment also allows complex scripts, functions and macros to be written and saved by the user for instance so that the user can add a new partitioning algorithm.

The main compilation stages of the process flow are software or hardware specific. Basically at module 412 the system schedules and allocates any behavioral parts of the hardware description, and at module 416 compiles the software description to assembly code. At module 418 it also writes a parameterized description of the processors to be used, which may also have been designed by the user. These individual steps will be explained in more detail.

Hardware Compilation

The parts of the description to be compiled into hardware use a behavioral synthesis compiler 412 using the techniques of De Michelli mentioned above. The description is translated to a control/data flow graph, scheduled (i.e. what happens on each clock cycle is established) and bound (i.e. which resources are used for which operations is established), optimized, and then an RT-level description is produced.

Many designers want to have more control over the timing characteristics of their hardware implementation. Consequently the invention also allows the designer to write parts of the input description corresponding to certain hardware at the register transfer level, and so define the cycle-by-cycle behavior of that hardware.

This is done by using a known RT-level description with a well-defined timing semantics such as Handel-C. In such a description each assignment takes one clock cycle to execute, control structures add only combinational delay, and communications take one clock cycle as soon as both processes are ready. With the invention an extra statement is added to this RT-level version of the language: "delay" is a statement which uses one clock cycle but has no other effect. Further, the "par" attribute may again be used to specify statements which should be executed in parallel.

Writing the description at this level, together with the ability to define constraints for the longest combinational path in the circuit, gives the designer close control of the timing characteristics of the circuit when this is necessary. It allows, for example, closer reasoning about the correctness of programs where parallel processes write to the same variable. This extra control has a price: the program must be refined from the more general C description, and the programmer is responsible for thinking about what the program is doing on a cycle-by-cycle basis. An example of a description of a processor at this level will be discussed later.

The result of the hardware compilation by the behavioral synthesizer 412 is an RTL description which can be output to a RTL synthesis system 414 using a hardware description language (e.g. Handel-C or VHDL), or else synthesized to a gate level description using the techniques of De Michelli.

RTL synthesis optimizes the hardware description, and maps it to a given technology. This is performed using standard techniques.

Software Compilation

The software compiler 416 largely uses standard techniques [e.g. from Aho, Sethi and Ullman mentioned above]. In addition, parallelism is supported by mapping the invention's CSP-like model of parallelism and communication primitives into the target model. For instance channels can be mapped to blocks of shared memory protected by semaphores. CSP is described in C.A.R. Hoare "Communicating sequential processes." Prentice-Hall International series in computing science. Prentice-Hall International, Englewood Cliffs, N.J. which is hereby incorporated by reference.

Compound operations which are not supported directly by the processor are decomposed into their constituent parts, or mapped to operations on libraries. For example multiply can be decomposed into shifts and adds. Greedy pattern matching is then used to map simple operations into any more complex instructions which are supported by the processor. Software can also be compiled to standard ANSI C, which can then be compiled using a standard compiler. Parallelism is supported by mapping the model in the input language to the model of parallelism supported by the C compiler, libraries and operating system being used.

The software compiler is organized in an object oriented way to allow users to add support for different processors (see FIG. 3) and for processor parameterizations. For example, in the processor parameterize 418 unused instructions from the processor description are automatically removed, and support for additional instructions can be added. This embodiment of the invention, includes some prewritten processor descriptions which can be selected by the user. It contains parameterized descriptions of three processors, and the software architecture is designed so that it is easy for developers to add new descriptions which can be completely new or refinements of these. The three processors provided are A Mips-like processor, similar to that described in [Patterson and Hennessy, Computer Organization and Design, 2"d Edition, Morgan Kauffman].

A 2-cycle non-pipelined stack-based processor (see below).

A more sophisticated multicycle non-pipelined stack-based processor, with a variable number of cycles per instruction, and hardware support for parallelism and channels.

Thus the software compiler supports many processor parameterizations. More complex and unexpected modifications are supported by virtue of the object oriented design of the compiler, which allows small additions to be made easily by the user. Most of the mapping functions can be inherited from existing processor objects, minor additions can be made a function used to calculate the speed and area of processor given the parameterizations of the processor and a given program.

The output of the software compilation/processor parameterization process is machine code to run on the processor together with a description of the processor to be used (if it is not a standard one).

Figure 6:
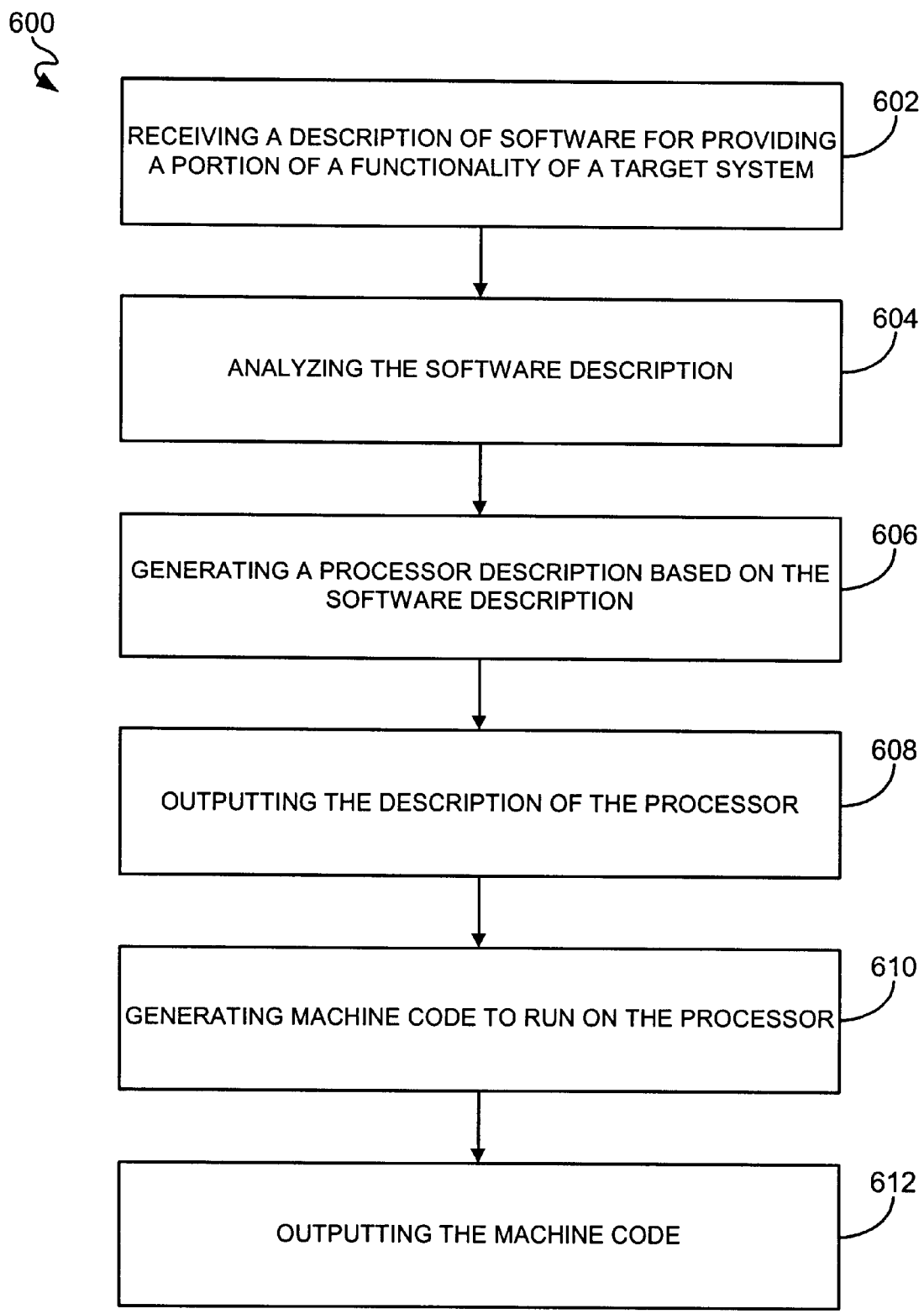
FIG. 6 is a flowchart of a process for compiling software in a codesign system in accordance with an embodiment of the present invention.

FIG. 6 is a flowchart of a process 600 for compiling software in a codesign system in accordance with an embodiment of the present invention. A description of software is received for providing a portion of a functionality of a target system in operation 602. The software description is analyzed in operation 604 and a processor description is generated based on the software description in operation 606. The description of the processor is outputted in operation 608. Machine code is generated to run on the processor in operation 610. The machine code is also outputted in operation 612.

In one aspect of the present invention, parallelism may be supported. In another aspect, compound operations not directly supported by the processor may be decomposed into constituent parts. In a further aspect, compound operations not directly supported by the processor may be mapped to operations in at least one library. In an additional aspect, support can be added for different processors. In even a further aspect, the description of the processor may be parameterized.

Co-Simulation and Estimation

The scheduled hardware, register transfer level hardware, software and processor descriptions are then combined. This allows a cycle-accurate co-simulation to be carried out, e.g. using the known Handel-C simulator, though a standard VHDL or Verilog simulator and compiler could be used.

Handel-C provides estimation of the speed and area of the design, which is written as an HTML file to be viewed using a standard browser, such as Netscape. The file shows two versions of the program: in one each statement is colored according to how much area it occupies, and in the other according to how much combinational delay it generates. The brighter the color for each statement, the greater the area or delay. This provides a quick visual feedback to the user of the consequences of design decisions.

The Handel-C simulator is a fast cycle-accurate simulator which uses the C-like nature of the specification to produce an executable which simulates the design. It has an X-windows interface which allows the user to view VGA video output at about one frame per second.

When the user is happy with the RT-level simulation and the design estimates then the design can be compiled to a netlist. This is then mapped, placed and routed using the FPGA vendor's tools.

The simulator can be used to collect profiling information for sets of typical input data, which will be used by the partitioner 408 to estimate data dependent values, by inserting data gathering operations into the output code.

Implementation Language

The above embodiment of the system was written in objective CAML which is a strongly typed functional programming language which is a version of ML but obviously it could be written in other languages such as C.

Provable Correctness

A subset of the above system could be used to provide a provably correct compilation strategy. This subset would include the channel communication and parallelism of OCCAM and CSP. A formal semantics of the language could be used together with a set of transformations and a mathematician, to develop a provably correct partitioning and compilation route.

Figure 7:
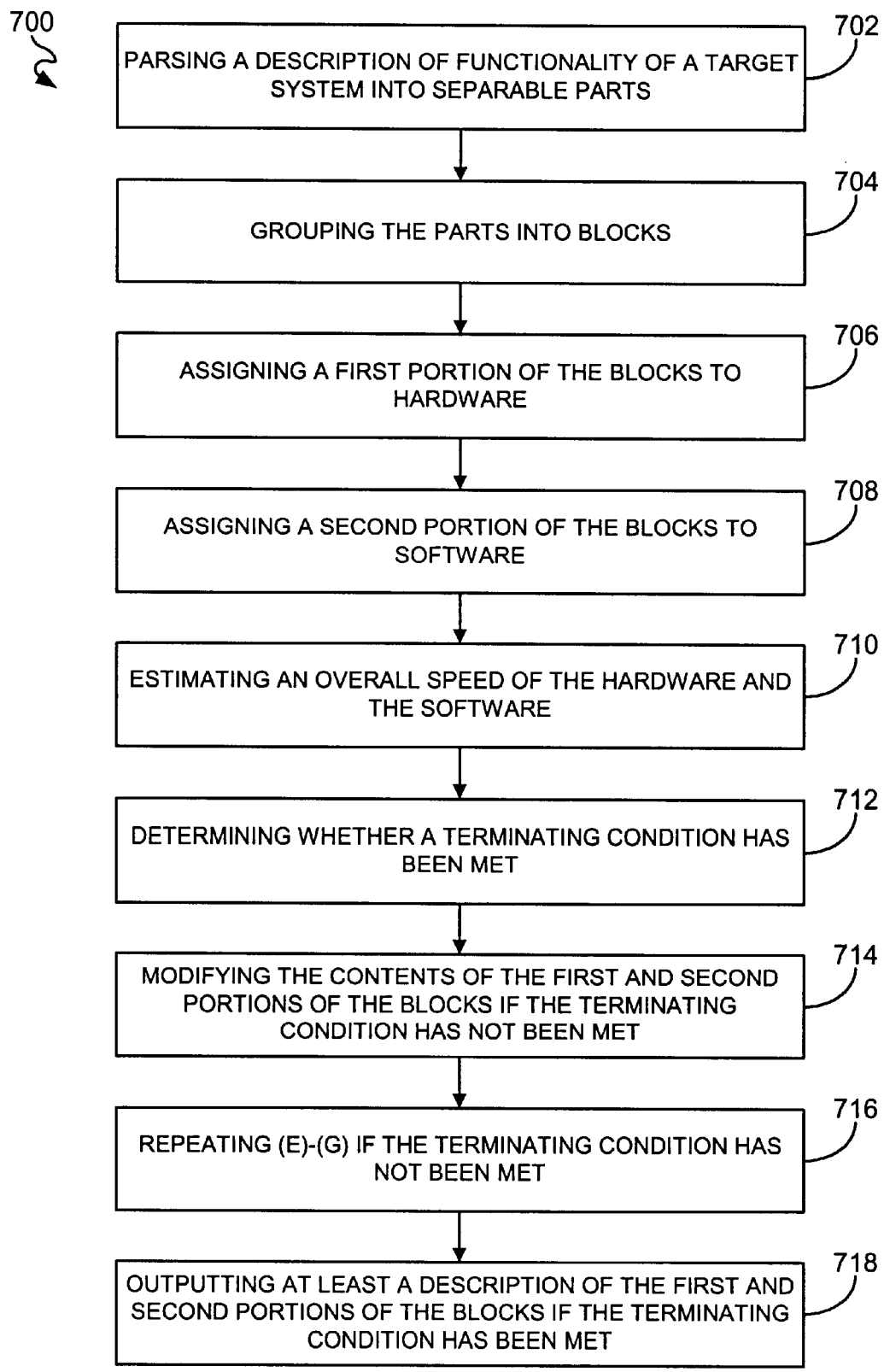
FIG. 7 is a flowchart for a process for hardware/software partitioning in accordance with an embodiment of the present invention.

FIG. 7 is a flowchart for a process 700 for hardware/software partitioning in accordance with an embodiment of the present invention. A description of functionality of a target system is parsed into separable parts in operation 702 which are then grouped into blocks in operation 704. A first portion of the blocks is assigned to hardware in operation 706 and a second portion of the blocks is assigned to software in operation 708. An overall speed of the hardware and the software is estimated in operation 710. Subsequently, a determination is made as to whether a terminating condition has been met in operation 712. If the terminating condition has not been met, then the contents of the first and second portions of the blocks are modified in operation 714 and the above operations are repeated in operation 716. If the terminating condition has been met, then at least a description of the first and second portions of the blocks is outputted in operation 718.

In one aspect of the present invention, a size of each of the blocks may be defined by a user. In an embodiment of the present invention, a determining may be made as to whether the hardware can accommodate the first portion of the blocks. In another embodiment, a speed of interfaces may be estimated. In one aspect, the modification of the contents of the first and second portions may be based at least in part on the speed estimate. In a further embodiment, the hardware and software may be simulated so that the modification of the contents of the first and second portions can be based at least in part on the simulation.

Some examples of target systems designed using the invention will now be described.

EXAMPLE 1

Processor Design

The description of the processor to be used to run the software part of the target system may itself be written in the C-like input language and compiled using the codesign system. As it is such an important element of the final design most users will want to write it at the register transfer level, in order to hand-craft important parts of the design. Alternatively the user may use the predefined processors, provided by the codesign system or write the description in VHDL or even at gate level, and merge it into the design using an FPGA vendor's tools.

With this system the user can parameterize the processor design in nearly any way that he or she wishes as discussed above in connection with the software compilation and as detailed below.

The first processor parameterization to consider is removing redundant logic. Unused instructions can be removed, along with unused resources, such as the floating point unit or expression stack.

The second parameterization is to add resources. Extra RAMS and ROMs can be added. The instruction set can be extended from user assigned instruction definitions. Power-on bootstrap facilities can be added.

The third parameterization is to tune the size of the used resources. The bit widths of the program counter, stack pointer, general registers and the opcode and operand portions of the instruction register can be set. The size of internal memory and of the stack or stacks can be set, the number and priorities of interrupts can be defined, and channels needed to communicate with external resources can be added. This freedom to add communication channels is a great benefit of codesign using a parametrizable processor, as the bandwidth between hardware and software can be changed to suit the application and hardware/software partitioning.

Finally, the assignment of opcodes can be made, and instruction decoding rearranged.

The user may think of other parameterizations, and the object oriented processor description allows this. The description of a very simple stack-based processor in this style (which is actually one of the pre-written processors provided by the codesign system for use by the user) is listed in Appendix 1.

Referring to Appendix 1, the processor starts with a definition of the instruction width, and the width of the internal memory and stack addresses. This is followed by an assignment of the processor opcodes. Next the registers are defined; the declaration "unsigned x y, z" declares unsigned integers y and z of width x. The program counter, instruction register and top-of-stack are the instruction width; the stack pointer is the width of the stack.

After these declarations the processor is defined. This is a simple non-pipelined two-cycle processor. On the first cycle (the first three-line "par"), the next instruction is fetched from memory, the program counter is incremented, and the top of the stack is saved. On the second cycle the instruction is decoded and executed. In this simple example a big switch statement selects the fragment of code which is to be executed.

This simple example illustrates a number of points. Various parameters, such as the width of registers and the depth of the stack can be set. Instructions can be added by including extra cases in the switch statement. Unused instructions and resources can be deleted, and opcodes can be assigned.

The example also introduces a few other features of the register transfer level 30 language such as ROM and RAM declarations.

Figure 8:
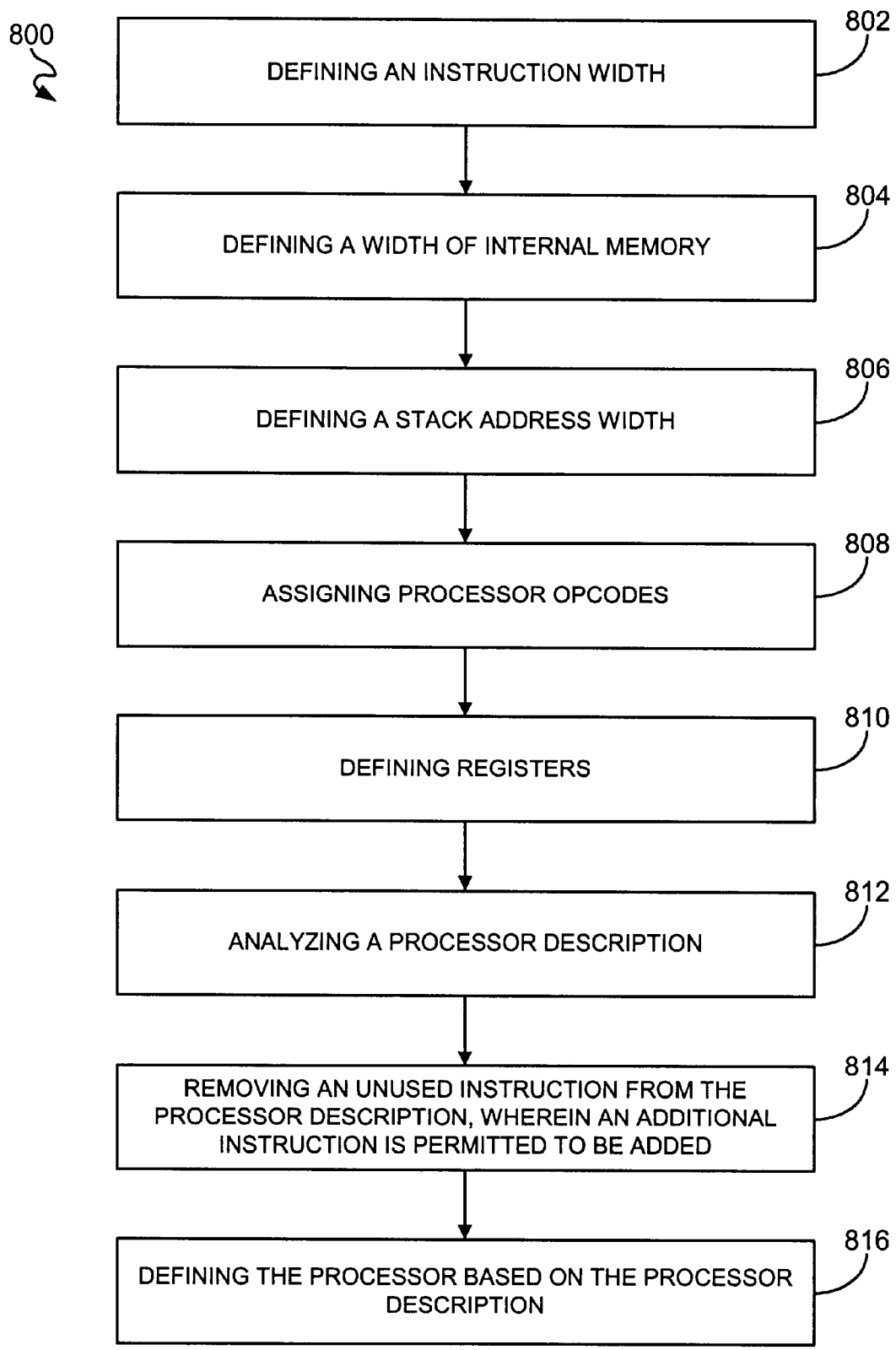
FIG. 8 is a flowchart of a process for designing a processor in accordance with an embodiment of the present invention.

FIG. 8 is a flowchart of a process 800 for designing a processor in accordance with an embodiment of the present invention. An instruction width, a width of internal memory, and a stack address width are defined in operation 802, 804, and 806. Processor opcodes are then assigned in operation 808. Registers are defined in operation 810 and a processor description is analyzed in operation 812. An unused instruction is removed from the processor description in operation 814 so that an additional instruction is permitted to be added and the processor is defined based on the processor description in operation 816.

In one aspect of the present invention, the processor may be defined at a register transfer level. In another aspect, the instructions may be added by including an extra case in a switch statement. In a further aspect, a width of a register and/or a stack depth may also be defined. In an additional aspect, the processor description may include user-defined parameters. In yet one more aspect, the processor definition may be used for emulating the processor on a Field Programmable Gate Array (FPGA).

Figure 9:
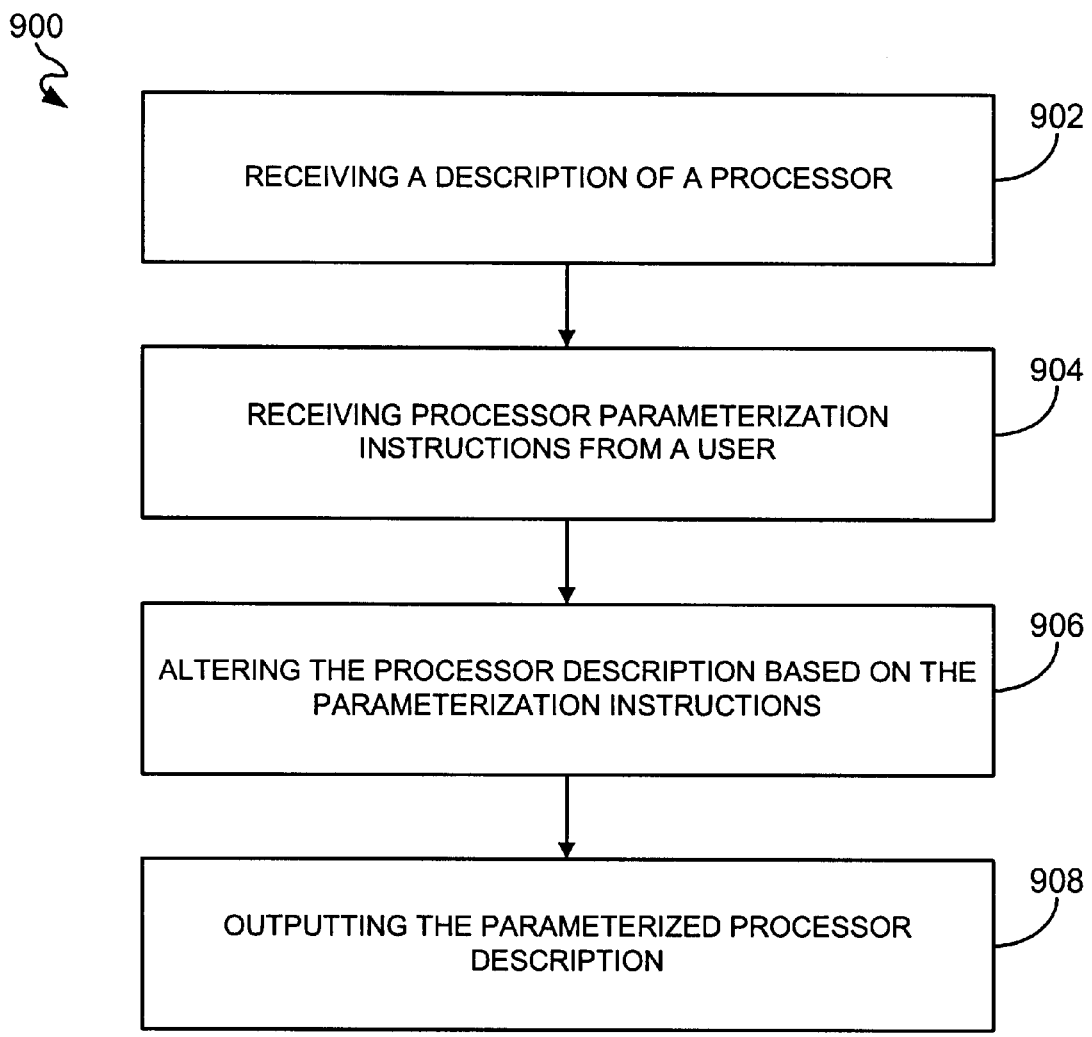
FIG. 9 is a flowchart of a process for processor parameterization in accordance with an embodiment of the present invention.

FIG. 9 is a flowchart of a process 900 for processor parameterization in accordance with an embodiment of the present invention. A description of a processor is received in operation 902. Processor parameterization instructions is received from a user in operation 904. The processor description is then altered based on the parameterization instructions in operation 906 and the parameterized processor description is outputted in operation 908.

In one aspect of the present invention, the parameterization may include removing an unused instruction. In another aspect, the parameterization may include adding a resource. In a further aspect, the parameterization may include tuning a size of resources. In an additional aspect, the parameterization may include assignment of opcodes and rearrangement of instruction decoding. In an embodiment of the present invention, the processor may be created in reconfigurable logic.

EXAMPLE 2

Video Game

To illustrate the use of the invention using an application which is small enough to describe easily a simple Internet video game was designed. The target system is a video game in which the user can fly a plane over a detailed background picture. Another user can be dialed up, and the screen shows both the local plane and a plane controlled remotely by the other user. The main challenge for the design is that the system must be implemented on a single medium-sized FPGA.

Implementation Platform

The platform for this application was a generic and simple FPGA-based board. A block diagram of the board 1000, a Hammond board, is shown in FIG. 10, and a graphical depiction of the board 1000 is shown in FIG. 11.

The Hammond board contains a Xilinx 4000 series FPGA and 256 kb synchronous static RAM. Three buttons provide a simple input device to control the plane; alternatively a standard computer keyboard can be plugged into the board. There is a parallel port which is used to configure the FPGA, and a serial port. The board can be clocked at 20 MHz from a crystal, or from a PLL controlled by the FPGA. Three groups of four pins of the FPGA are connected to a resistor network which gives a simple digital to analogue converter, which can be used to provide 12 bit VGA video by implementing a suitable sync generator on the FPGA. Problem description and discussion The specification of the video game system is as follows:

The system must dial up an Internet service provider, and establish a connection with the remote game. which will be running on a workstation.

The system must display a reconfigurable background picture.

The system must display on a VGA monitor a picture of two planes: the local plane and the remote plane. The position of the local plane will be controlled by the buttons on the Hammond board.

The position of the remote plane will be received over the dialup connection every time it changes.

The position of the local plane will be sent over the dialup, connection every time it changes.

This simple problem combines some hard timing constraints, such as sending a stream of video to the monitor, with some complex tasks without timing constraints, such as connecting to the Internet service provider. There is also an illustration of contention for a shared resource, which will be discussed later.

System Design

A block diagram of the system 1200 is shown in FIG. 12. The system design decisions were quite straightforward. A VGA monitor 1202 is plugged straight into the Hammond board 1000. To avoid the need to make an electrical connection to the telephone network a modem 1204 can be used, and plugged into the serial port of the Hammond board. Otherwise it is quite feasible to build a simple modem in the FPGA.

The subsystems required are:

serial port interface, dial up, establishing the network connection, sending the position of the local plane, receiving the position of the remote plane, displaying the background picture, displaying the planes.

A simple way of generating the video is to build a sync generator in the FPGA, and calculate and output each pixel of VGA video at the pixel rate. The background picture can be stored in a "picture RAM". The planes can be stored. As a set of 8×8 characters in a "character generator ROM", and the contents of each of the characters' positions on the screen stored in a "character location RAM.

Hardware/Software Partitioning

The hardware portions of the design are dictated by the need of some part of the system to meet tight timing constraints. These are the video generation circuitry and the port drivers. Consequently these were allocated to hardware, and their C descriptions written at register transfer level to enable them to meet the timing constraints. The picture RAM and the character generator ROM and character location RAM were all stored in the Hammond board RAM bank as the size estimators showed that there would be insufficient space on the FPGA.

The parts of the design to be implemented in software are the dial-up and negotiation, establishing the network, and communicating the plane locations. These are non-time critical, and so can be mapped to software. The program is stored in the RAM bank, as there is not space for the application code in the FPGA. The main function is shown in Appendix 2. The first two lines declare some communication channels. Then the driver for the parallel port and sync generator are started, and the RAM is initialized with the background picture, the character memory and the program memory. The parallel communicating hardware and software process are then started, communicating over a channel hwswchan. The software establishes the network connection, and then enters a loop which transmits and receives the position of the local and remote plane, and sends new positions to the display process.

Processor Design

The simple stack-based processor from Appendix 1 was parameterized in the following ways to run this software. The width of the processor was made to be 10 bits, which is sufficient to address a character on the screen in a single word. No interrupts were required, so these were removed, as were a number of unused instructions, and the internal memory.

Co-Simulation

Figure 13:
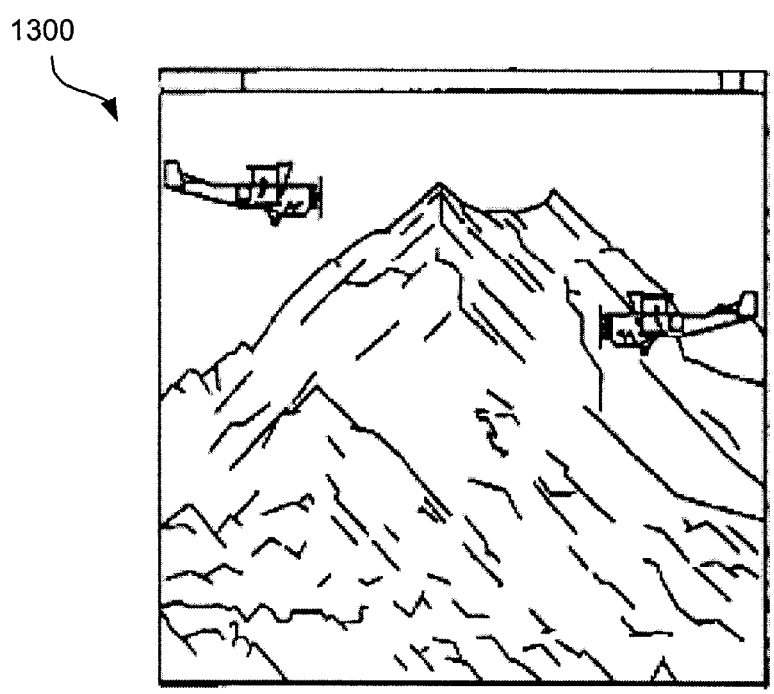
FIG. 13 is a simulation of the display produced by the example of FIGS. 10 to 12.

The RT-level design was simulated using the Handel-C simulator. Sample input files mimicking the expected inputs from the peripherals were prepared, and these were fed into the simulator. A black and white picture 1300 of the color display is shown in FIG. 13 (representing a snapshot of the X window drawn by the co-simulator).

The design was then placed and routed using the proprietary Xilinx tools, and successfully fit into the Xilinx 4013 FPGA on the Hammond board.

This application would not have been easy to implement without the codesign system of the invention. A hardware-only solution would not have fitted. onto the FPGA; a software-only solution would not have been able to generate the video and interface with the ports at the required speed. The invention allows the functionality of the target system to be partitioned while parameterizing the processor to provide an optimal system.

Real World Complications

The codesign system was presented with an implementation challenge with this design. The processor had to access the RAM (because that is where the program was stored), whilst the hardware display process simultaneously had to access the RAM because this is where the background picture, character map and screen map were stored. This memory contention problem was made more difficult to overcome because of an implementation decision made during the design of the Hammond board: for a read cycle the synchronous static RAM which was used requires the address to be presented the cycle before the data is returned.

The display process needs to be able to access the memory without delay, because of the tight timing constraints placed on it. A semaphore is used to indicate when the display process requires the memory. In this case the processor stalls until the semaphore is lowered. On the next cycle the processor then presents to the memory the address of the next instruction, which in some cases may already have been presented once.

The designer was able to overcome this problem using the codesign system of invention because of the facility for some manual partitioning by the user and describing some parts of the design at the register transfer level to give close control over those parts. Thus while assisting the user, the system allows close control where desired.

EXAMPLE 3

Mass-Spring Simulation

Introduction

The "springs" program is a small example of a codesign programmed in the C-like language mentioned above. It performs a simulation of a simple mass-spring system, with a real time display on a monitor, and interaction via a pair of buttons.

Design

The design consists of three parts: a process computing the motion of the masses, a process rendering the positions of the masses into line segments, and a process which displays these segments and supplies the monitor with appropriate synchronization signals. The first two processes are written in a single C-like program. The display process is hard real-time and so requires a language which can control external signals at the resolution of a single clock cycle, so for this reason it is implemented using an RTL description (Handel-C in this instance).

Figure 15:
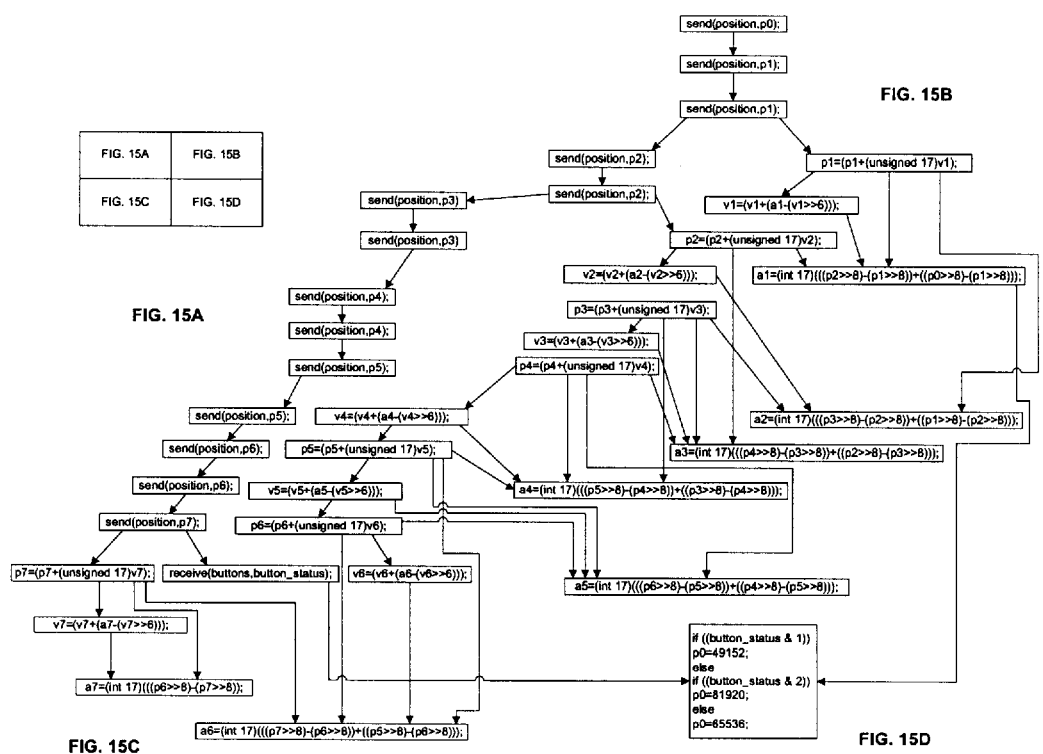
FIGS. 15A–D are a block diagram showing a dependency graph for calculation of the variables in the FIG. 8 example.

These two programs are shown in Appendix 3. They will be explained below, together with the partitioning process and the resulting implementation. FIG. 14 is a block diagram of the ultimate implementation, together with a representation of the display of the masses and springs. FIG. 15 is a dependency graph for calculation of the variables required.

Mass Motion Process

The mass motion process first sets up the initial positions, velocities and acceleration of the masses. This can be seen in Appendix 3 where positions p0 to p7 are initialized as 65536. The program then continues in an infinite loop, consisting of: sending pairs of mass positions to the rendering process, computing updated positions based on the velocities of the masses, computing updated velocities based on the accelerations of the masses, and computing accelerations based on the positions of the masses according to Hooke's law. The process then reads the status of the control buttons and sets the position of one of the masses accordingly. This can be seen in Appendix 3 as the statement "received (buttons, button status)"

This process is quite compute intensive over a short period (requiring quite a number of operations to perform the motion calculation), but since these only occur once per frame of video the amortized time available for the calculation is quite long.

Rendering Process

The rendering process runs an infinite loop performing the following operations: reading a pair of mass positions from the mass motion process then interpolate in between these two positions for the next 64 lines of video output. A pair of interpolated positions is sent to the R T L display process once per line. This is a relatively simple process with only one calculation, but this must be performed very regularly.

Display Process

The display process (which is written in Handel-C) and is illustrated in Appendix 3 reads start and end positions from the rendering process and drives the video color signal between these positions on a scan line. Simultaneously, it drives the synchronization signals for the monitor. At the end of each frame it reads the values from the external buttons and sends these to the mass motion process.

Partitioning by the Codesign System

The design could be partitioned it in a large number of ways. It could partition the entire design into hardware or into software, partition the design at the high-level, by the first two processes described above and compiling them using one of the possible routes, or it can partition the design at a lower level, and generate further parallel processes communicating with each other. Whatever choice the partitioner makes, it maintains the functional correctness of the design, but will change the cost of the implementation (in terms of the area, clock cycles and so forth). The user may direct the partitioner to choose one of the options above the others. A number of the options are described below.

Pure Hardware

The partitioner could map the first two processes directly into Handel-C, after performing some additional parallelization. The problem with this approach is that each one of the operations in the mass motion process will be dedicated to its own piece of hardware, in an effort to increase performance. However, as discussed above, this is unnecessary as these calculations can be performed at a slower speed. The result is a design that can perform quickly enough but which is too large to fit on a single FPGA. This problem would be recognized by the partitioner using its area estimation techniques.

Pure Software

An alternative approach is for the partitioner to map the two processes into software running on a parameterized threaded processor. This reduces the area required, since the repeated operations of the mass motion calculations are performed with a single operation inside the processor. However, since the processor must swap between doing the mass motion calculations and the rendering calculations, overhead is introduced which causes it to run too slowly to display in real-time. The partitioner can recognize this by using the speed estimator, based on the profiling information gathered from simulations of the system.

Software/Software

Another alternative would be for the partitioner to generate a pair of parameterized processors running in parallel, the first calculating motion and the second performing the rendering. The area required is still smaller than the pure hardware approach, and the speed is now sufficient to implement the system in real time. However, using a parameterized processor for the rendering process adds some overhead (for instance, performing the instruction decoding), which is unnecessary. So although the solution works, it is a sub optimal.

Hardware/Software

The best solution, and the one chosen by the partitioner, is to partition the mass motion process into software for a parameterized, unthreaded processor, and to partition the rendering process 1410 which was written at a behavioral level together with the position, velocity and acceleration calculations 1406 into hardware. This solution has the minimum area of the options considered, and performs sufficiently quickly to satisfy the real time display process.

Thus referring to FIG. 14, the behavioral part of the system 1402 includes the calculation of the positions, velocities and accelerations of the masses at 1406 (which will subsequently be partitioned to software), and the line and drawing processes at 1410 (which will subsequently be partitioned to hardware). The RTL hardware 1420 is used to receive the input from the buttons at 1422 and output the video at 1424.

Thus the partitioner 408 used the estimators 420, 422 and 424 to estimate the speed and area of each possible partition based on the use of a customized processor. The interface cosynthesizer 410 implements the interface between hardware and software on two FPGA channels 1404 and 1408 and these are used to transfer a position information to the rendering process and to transfer the button information to the position calculation 1406 from button input 1422.

The width adjuster 406, which is working on the mass motion part of the problem to be partitioned to software, parameterizes the processor to have a width of 17 bits and adjusts the width of "curr_pos" which is the current position to nine bits, the width of the segment channel. The processor parameterize at 17 further parameterizes the processor by removing unused instructions such as multiply, interrupts, and the data memory is reduced and multi-threading is removed. Further, op codes are assigned and the operator width is adjusted.

The description of the video output 1424 and button interface 1422 were, in this case, written in an R T L language, so there is no behavioral synthesis to be done for them. Further, because the hardware will be formed on an FPGA, no width adjustment is necessary because the width can be set as desired.

The partitioner 408 generates a dependency graph as shown in FIG. 15 which indicates which variables depend on which. It is used by the partitioner to determine the communications costs associated with the partitioning, for instance to assess the need for variables to be passed from one resource to another given a particular partitioning.

Partitioning Tools

One embodiment of the present invention includes a codesign system for reconfigurable platforms. In this, an executable specification written in Java can be manually partitioned at the method level and compiled into hardware (via VHDL) and software. The software runs on a modified Java Virtual Machine which contains extensions for interfacing with the hardware. The partitioned system can be implemented on a microcontroller and an FPGA. Such a system is capable of implementing significant speedups, but it is noted that these are somewhat domain specific and that the flow developed still requires manual intervention down to the level of place and route. One of the most apparent results from this work is that much effort needs to go into considering the interfaces constructed when partitioning between hardware and software.

One example of hardware/software codesign is the integration of dedicated hardware, programmable DSPs and processors in cellular phones.

Programming Languages

The present invention supports a wide range of languages used to implement designs. For example, RTL-level VHDL is used in final hardware design, although executable models of hardware are sometimes constructed in languages including C and C++. Similarly, software development is variously carried out in C, C++, and Java. A wide range of languages is typical within an environment more oriented towards research. Across the wider company, C is often used as a language for executable specifications because of its wide acceptability (particularly to both hardware and software engineers).

One common theme in the codesign flows of the present invention is the use of C as a modeling language. It is particularly popular as it represents the common ground between hardware and software engineers. For this reason, the partitioning tool of the present invention assists in the refinement of these C models to Handel-C, C and interfaces. C is also common as a software language for finished systems. For hardware design, RTL level VHDL is the usual choice.

There is currently no standard flow from C models to fully partitioned synthesizable systems. Because of this, there are no external tool constraints on the construction of a flow involving Handel-C. A flow involving Handel-C, according to an embodiment of the present invention, consists of the same C model experimentation, followed by manual partitioning, recoding of C into Handel-C and the introduction of appropriate Interface constructs to cross the hardware/software boundary.

Note that various aspects of the present invention relate to design flows for reconfigurable end system as well as a prototyping step to ASICs. This can correspond to PC plus PCI-based FPGA board type systems, with a view to treating these systems as prototypes for future FPGA+processor systems-on-chips.

Handel-C can be used in two ways: as an FPGA design tool, and as an ASIC design tool. Using FPGAs rather than ASICs is very cost efficient, especially if the company only produces rather small quantities of the ASICs they need, which is uneconomical. Also, prototyping with FPGAs and migrating to HardWire-style implementations for the final system is particularly attractive.

A few specific application areas have been identified. Most promising is image processing. The second area is realtime filter/control applications (such as thrust control). Finally, simple control and glue-logic applications are possible, but these do not greatly exploit Handel-C's algorithmic abilities.

Codesign flows can include:
1. A package of high-level hardware/software interface constructs built on top of a package provided with a PCI-based FPGA board type system. These might include buffered communications via memory regions, semaphores, etc.
2. A system in which a complete hardware/software codesign could be manually entered, with the user providing a hardware and software implementation for each function. The system would then estimate the performance of a given partition based on the users selections.
3. A system for estimating the potential performance of a codesign from a C executable specification, based on profiling information and estimates of interface performance.

Tools

This section outlines the specification for tools according to an embodiment of the present invention, with specific reference to the requirements expressed in the preceding section.

Most engineers have a strong a priori understanding about the partition between hardware and software. However, actual results sometimes contradicts this point of view: for example the communication latency in an application might offset the speedup gained by moving functionality to hardware. This type of problem seems to occur particularly frequently with applications of reconfigurable computing. There can be three possible reasons why this happens:

The engineers' intuitions about the best partition are incorrect.

The applications are poorly suited to reconfigurable acceleration.

The target platform is poorly designed or implemented, or a poor match for the application.

In fact, none of these reasons are wholly to blame. The engineers may be wrong, but that can be because they are working in a significantly unfamiliar implementation domain. The applications may be a good fit for reconfigurable acceleration, but it can be a hard task to judge just how much benefit can be gained. The target platform may be ill-suited to the application, but without enough feedback better platforms can never be designed. These problems all boil down to two things:

1. .Not enough information about the application.
2. .Not enough information about the target platform.

Ultimately the goal is always to produce worthwhile solutions in short time periods. What is required is not a completely new methodology but a way of avoiding 'mistakes' by exploring large parts of the design space in a familiar environment, early on in the design cycle. Thus, the present invention provides a tool which allows reconfigurable application engineers to avoid these blind alleys.

Because executable specifications in C and C-type programming languages are the standard for programmers, the methodology of the present invention assumes a starting point of an engineer with a C application, and a set of functions which the engineer believes are targets for reconfigurable acceleration.

The tools of the present invention understand the nature of C-like languages, hardware, software and the specific platform in question. The starting point is to examine the input program itself. Looking at a simple loop, the number and type of operations performed in an iteration can be computed. In some cases the number of iterations may also be determined. Using a suitably sophisticated model of the target (for instance, a specific processor) a determination can be made as to a typical runtime. Manually, this is a remarkably long and tedious task.

The prior art solves this problem by the use of a profiling tool, such as GNU gprof. Such a tool records the real time taken by each function, and records the number of calls and the call graph (representing which functions call which other functions) for a particular run of the program. Normally the tools also allow accumulation over multiple runs. In this way the programmer is directed to which functions are running slowly and can use their skills to reduce the number of calls to, or to simplify the body of the function. In more extreme circumstances changes to algorithms, data-structures or application architecture may be required.

The information gained from profiling has one obvious limitation: it is specific to the platform on which the profiling has taken place. Modem processors are considerably different from the microcontrollers, FPGAs and older microprocessors used by the partners. A Pentium II processor is rather good at floating point operations, and runs at a considerable clock speed, but it can only perform a maximum of six operations per cycle and is prone to high-cost branch mispredictions. FPGAs are exactly opposite: floating point is highly inefficient; they typically run at relatively low clock speeds, but can perform a huge number of operations every cycle and rapidly change control path.

For engineers to profile on their desktop platforms is problematic in other ways. A function call on a Pentium is very cheap, but a call to a (possibly reconfigurable) hardware resource is likely to be expensive. Only by profiling the data transfer and combining this with a statistical analysis of the target platform can reasonable estimates be given for the performance of partitioned systems. This type of problem (that of dealing with the cost of moving data around the system) has plagued programmers of homogeneous parallel systems for many years now.

It is clear that much of the information returned from standard profiling techniques is not ideal for codesign problems. In addition, much useful information (such as data movement) is missing.

Figure 16:
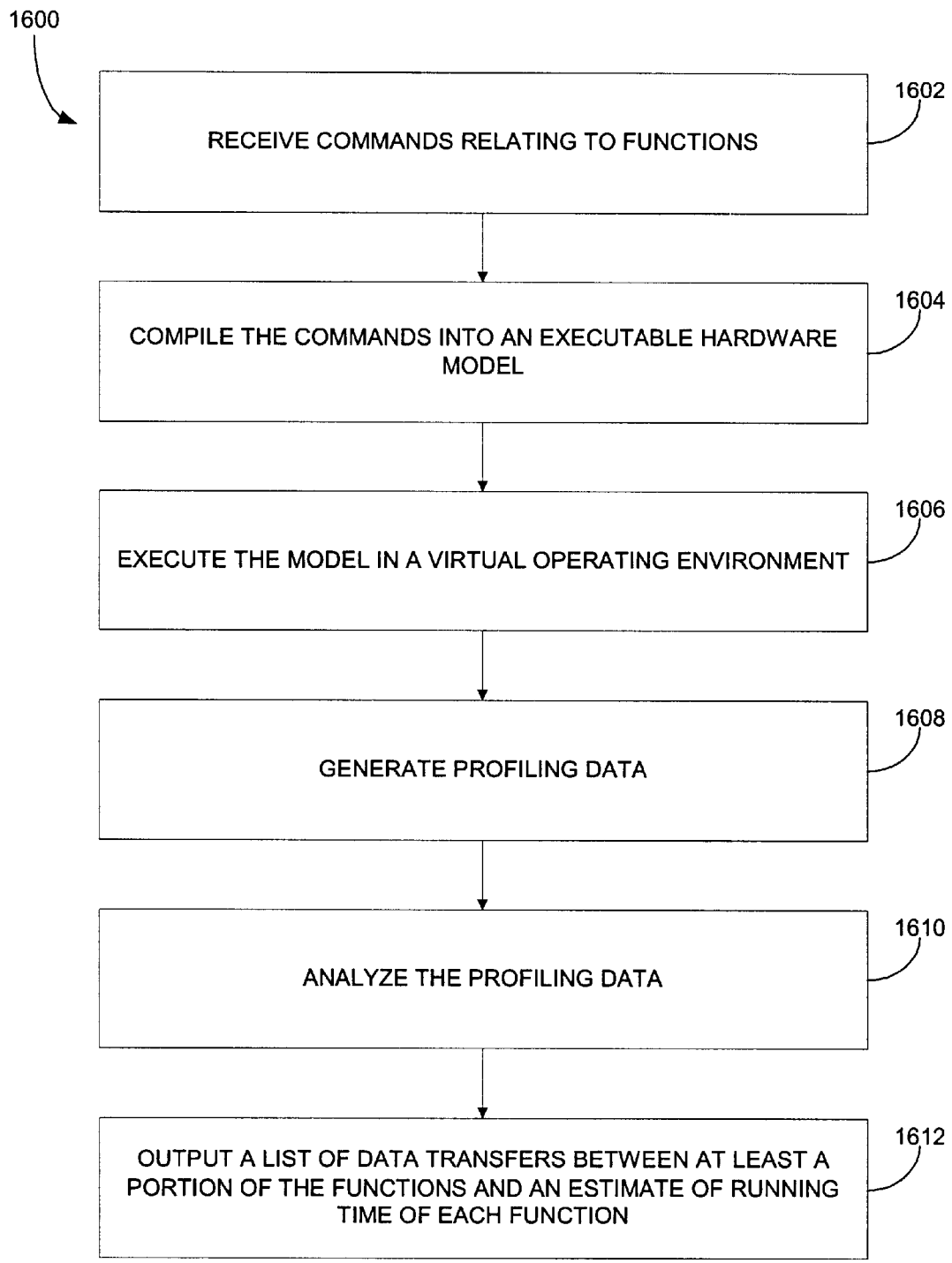
FIG. 16 is a flowchart of a process for estimating a potential performance of a codesign from an executable specification.

FIG. 16 depicts a process 1600 for estimating a potential performance of a codesign from an executable specification. In operation 1602, commands relating to functions are received. The commands are compiled into an executable hardware model in operation 1604. The model is executed in a virtual operating environment in operation 1606. In operation 1608, profiling data is generated during execution and, in operation 1610, is analyzed utilizing preexisting rules or user-input or defined rules. A list of data transfers between at least some of the functions is output in operation 1612. Also output is an estimate of running time of each function.

According to one aspect of the present invention, a number of operations performed by at least a portion of the functions are output. These can be further subdivided into classifications such as integer, floating point, and control operations. Further, a number of context switches between at least a portion of the functions can be output. A graph description file suitable for input to another tool can be output for allowing visualization of data flow.

In one aspect of the present invention, the profiling data is output to an analysis tool of a hardware/software co-design system. Preferably, the model is linked to an external library (outside the reach of the profiling system). This allows the operating environment of the model to remain largely unchanged between functional testing and profiling. As an option, the estimate of running time for each function is for a running time on at least one generic platform such as Windows 98/2000/NT, Macintosh, Java, etc.

Another objective of the present invention is to gather more detailed profiling information and to combine it with platform dependent variables, presenting an early-stage estimate of the performance of a given partition. The present invention provides three ways of obtaining this information:

Combine the output of existing profiling tools with semantic analysis of C source to deliver an enhanced profile.

Build a new profiler based on C-to-C translation.

Build a new profiler based on execution of C within a profitable virtual machine.

Each of these three options are discussed in more detail in the following paragraphs.

Augmented Profiling

Of the three options, this is perhaps the most straightforward to implement. In this embodiment, the C executable model is initially profiled in the normal way (with an existing tool). Another component of this tool is a semantic analyzer for C. A set of C functions is analyzed by the analyzer to get estimates of the sorts of operations performed, and the potential parallelism within the function. By using approximate models of the (profiled) host processor, and of the target reconfigurable platform, an estimate of the partitioned performance can be arrived at.

Figure 17:
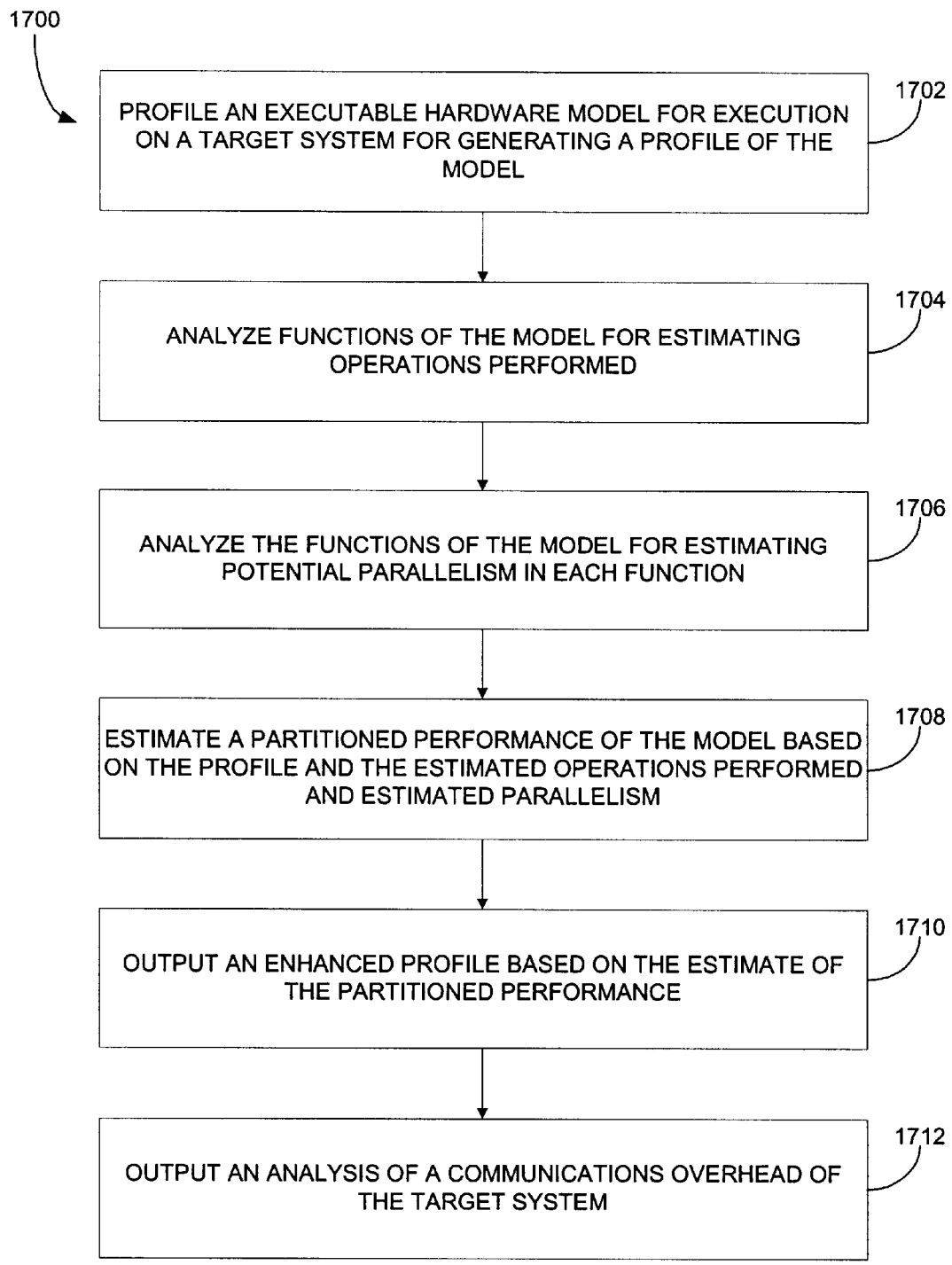
FIG. 17 is a flow diagram of a process for estimating performance of a system having functionality partitioned between hardware and software.

FIG. 17 is a flow diagram of a process 1700 for estimating performance of a system having functionality partitioned between hardware and software. An executable hardware model, such as a model in a C-like language, for execution on a target system is profiled in operation 1702 utilizing a profiling tool for generating a profile of the model. Functions of the C executable model are analyzed in operation 1704 utilizing an analysis tool for estimating operations performed. This step is preferably a semantic analysis of C source. The functions of the C executable model are analyzed in operation 1706 utilizing an analysis tool for estimating potential parallelism in each function. A partitioned performance of the model is estimated in operation 1708 based on the profile and the estimated operations performed and estimated parallelism. In operation 1710, an enhanced profile based on the estimate of the partitioned performance is output. An analysis of a communications overhead of the target system is performed in operation 1712.

In one aspect of the present invention, the target system includes a host processor and reconfigurable platform. Preferably, the model is written in a C programming language such as C, C++, Handel-C, or any other C-like language.

In another aspect of the present invention, the profiling of the model includes recording a time taken by each function of the model; recording a number of function calls for a particular run; and recording a call graph representing which functions call which other functions. As an option, the analysis of the functions of the model for estimating operations performed can include performing a semantic analysis of the model.

This technique minimizes risks associated with tool development and provides very good performance. The results are good, considering that the process may rely on a reverse transformation of host profiling results followed by forward transformation to the target platform.

C-to-C Translation

Standard profiling tools only supply information about the time spent in each function, the number of calls to each function and the call graph which indicates which functions are called by which. The aim of these profiling tools is to be as non-invasive as possible: if they substantially affect the execution of the program (including cache behaviors) then the profiling results returned will be inaccurate.

The present invention is different, since it is not interested in the exact run-time of the model on the host (profiling) platform. As a result, it is acceptable for the profiler to be substantially more invasive. The approach of the present invention is therefore to preprocess the C application, inserting calls to profiling functions wherever required. Thus, the present invention can gather arbitrarily detailed information, as well as interoperate with arbitrary external C libraries.

Figure 18:
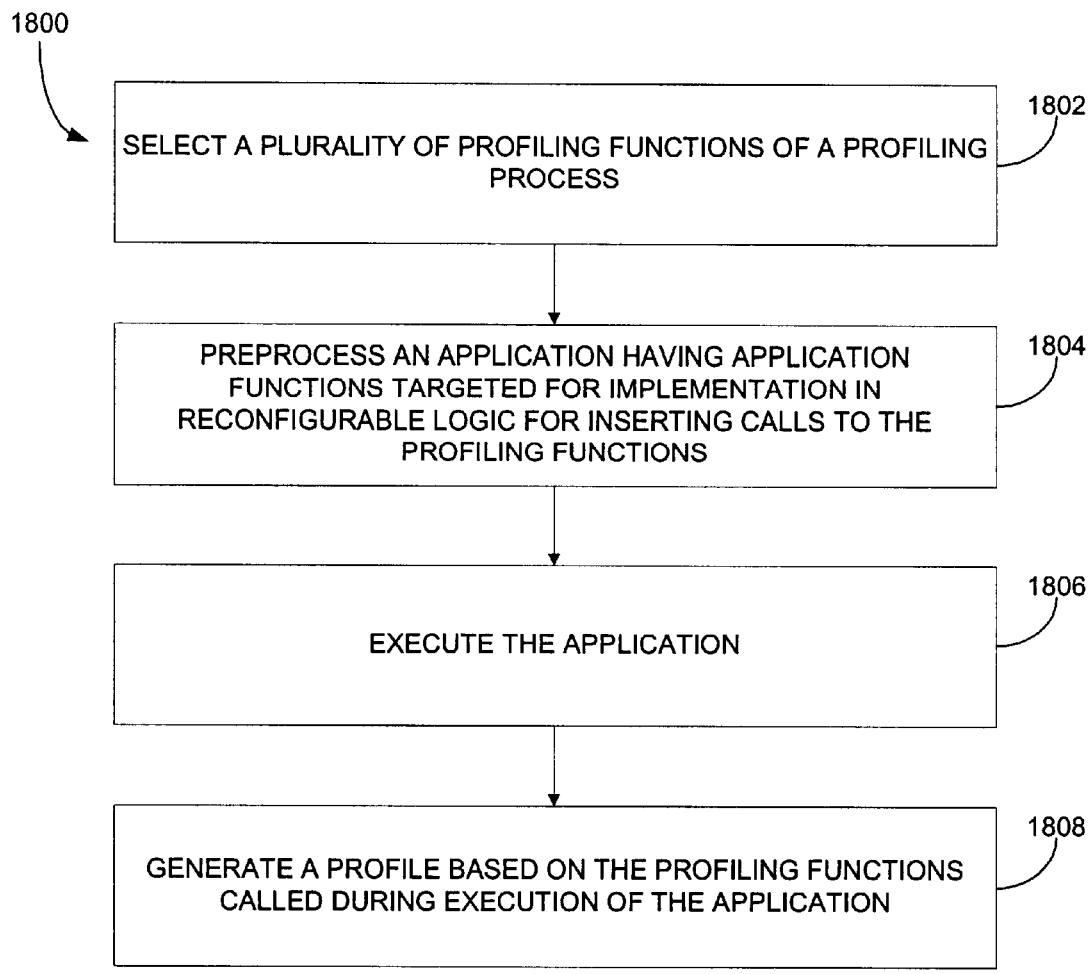
FIG. 18 is a flowchart depicting a process for profiling an executable hardware model according to one embodiment of the present invention.

FIG. 18 depicts a process 1800 for profiling an executable hardware model. In operation 1802, a plurality of profiling functions of a profiling process are selected. An application having application functions targeted for implementation in reconfigurable logic is preprocessed in operation 1804 for inserting calls to the selected profiling functions. The application is executed in operation 1806. In operation 1808, a profile is generated based on the profiling functions called during execution of the application.

In one aspect of the present invention, the profile includes a time taken by each application function, a number of calls to each application function, a call graph for illustrating calls between functions, dynamic control flow and/or memory transfers.

In another aspect of the present invention, the application is permitted to interoperate with an arbitrary external library. Preferably, the application is written in a C programming language such as C, C++, Handel-C, or any other C-like language.

A wealth of profiling information can be gathered using this technique, including dynamic control flow and memory transfers. Managing the amount of data collected may present a significant challenge in itself.

Virtual Machine

A variation on C-to-C translation is to execute some C code on a virtual machine. A compiler can be used to target the virtual machine. Gathering the profiling data is made more straightforward by this model, since each computation and memory operation is encoded by an instruction the virtual machine can gather exactly the profile required during execution. During the step of compiling to the virtual machine, either a new C compiler can be created, a new back-end to a freely available compiler such as gcc or lcc can be generated, or the virtual machine can be made to emulate an existing processor.

Figure 19:
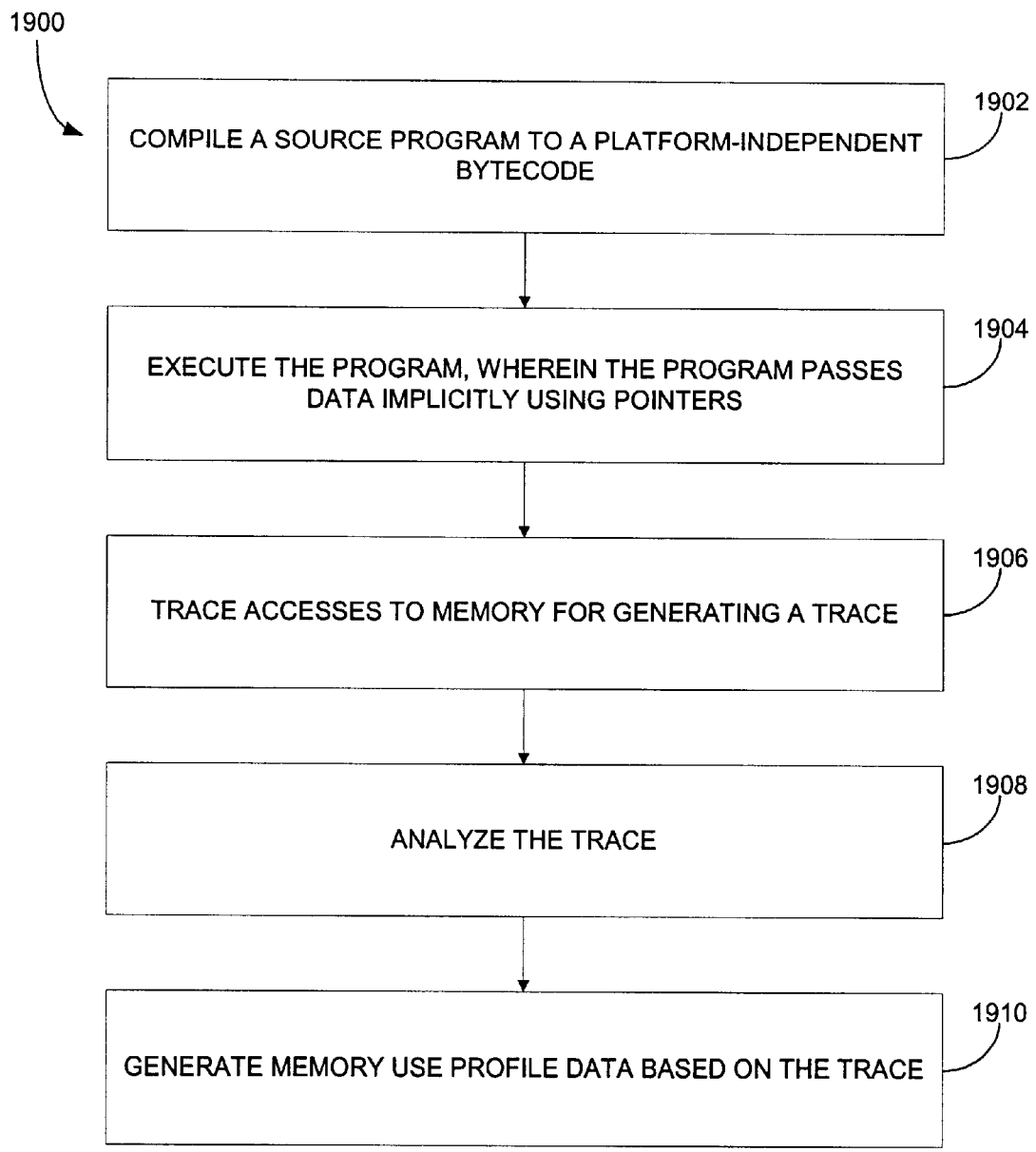
FIG. 19 is a flow diagram illustrating a process for program data transfer reporting.

FIG. 19 illustrates a process 1900 for program data transfer reporting. In operation 1902, a source program is compiled to a platform-independent bytecode. The program is executed in operation 1904. Note that the program passes data implicitly using pointers (as in C-type programming language) rather than by arguments and return values. Accesses to memory are traced in operation 1906 for generating a trace. The trace is analyzed in operation 1908. Memory use profile data is generated in operation 1910 based on the trace. This profile data can include any type of data useful for determining a cost of communicating data between two halves of the partition.

In one aspect of the present invention, the accesses to memory relate to load and store instructions. Preferably, the trace includes a map of all memory accessed during execution of a single function. The trace analysis can include determining where memory transfers take place between hardware and software domains of a partitioned system. As an option, the use profile data can include memory use behavior of portions of the program.

Communications

One of the most important factors in selecting a good partitioning of a program between hardware and software is to take into account the cost of communicating data between the two halves of the partition. The communication link between the hardware and software is determined by a number of parameters particular to a given target. These parameters include bandwidth, latency, and (per-message) overhead.

For some languages, it is possible to determine exactly the amount of data that would be transferred by an operation such as a function call, since all the data is passed in one direction by the arguments, and in the other direction by the return value. However, many other languages (including C) pass data implicitly using pointers. For these languages static analysis techniques cannot yield usefully accurate results. It is in this situation that the techniques presented are applicable.

The technique of an embodiment of the present invention relies on dynamic analysis of the source program. The source program is compiled to platform independent bytecode. A bytecode interpreter is augmented such that accesses to memory (typically load and store instructions) can be traced. In this way the memory use behavior of each part of the source program can be examined by executing the program and analyzing the generated trace.

A simplistic implementation of this technique generates a very large amount of profiling data. The present invention provides two alternative techniques to make the data more manageable:

In the first instance, during execution of a single function (or set of functions grouped as a domain) a map of all the memory accessed is recorded. At the end of execution of the function, only a compressed version of this map (compressed using a technique such as run-length encoding) is output. Since functions will typically tend to use blocks of memory in ranges, rather than a fully random access pattern, this results in significant savings in the size of the generated output. The output is then analyzed post-hoc to determine where memory transfers would have taken place between domains of a partitioned system.

Alternatively, some of the analysis can happen on-line during the execution of the program. In this case, a memory map of the program is again kept. Only this time, the map records which functions (or groups of functions) have valid copies of small ranges of memory (micropages) When a function reads for an area of memory, this map is checked to see which functions have a valid copy of the data. If the current function has a valid copy no further action is taken. If no function has a valid copy of the data then it is taken as coming from an external source function. Otherwise a transfer from one of the other functions to the current function is recorded, and the map records that the current function now has a valid copy of the micropage. When a write occurs, exactly the same action takes place except the ownership of the micropage becomes only the current function, no other functions now possess valid (up-to-date) copies of the data in the given page. The result of the execution of a program in this way is a 2-dimensional table recording data transfers from functions to functions. This data can then be further analyzed to give estimates for the performance of given partitions, be used to decide partitions, or be presented in a graphical form (such as a directed graph). It has been assumed in the above that the compiled code is executed within a virtual machine. It is possible via modification to the compiler to generate native code with appropriate traps on memory accesses and calls to functions implemented either of the above strategies. This results in an improvement in performance over the bytecode alternative.

Interoperability with C

Interoperability with C libraries is provided by one embodiment of the present invention. At the very least we must support libc (the standard C library), and probably libm (the standard maths library). Ideally every available library (including windowing systems, networking code, numeric libraries and so on) should be supported. One embodiment of the present invention creates profiled versions of these libraries.

Profiling Memory Transfers

Figure 20:
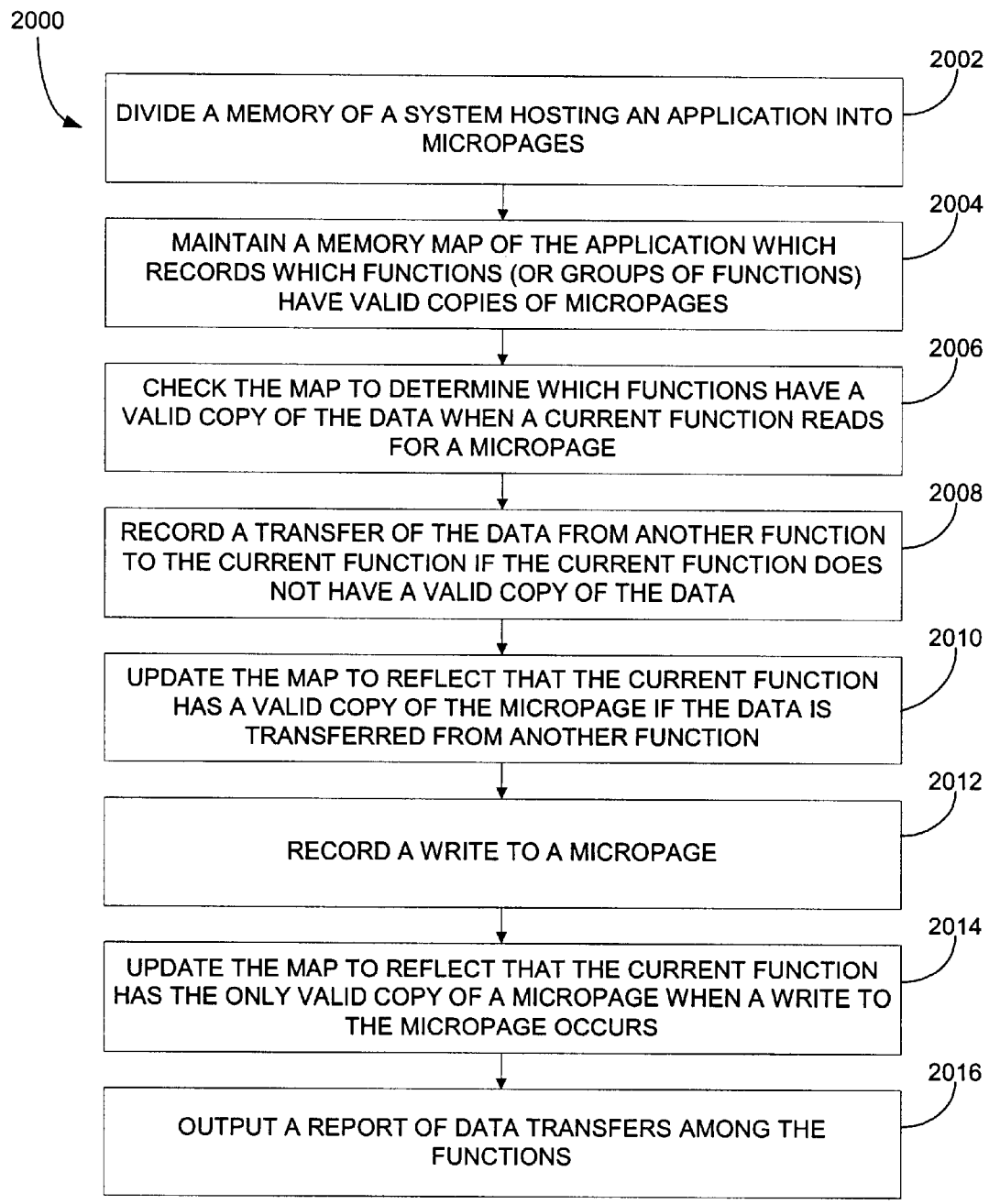
FIG. 20 is a flowchart of a process for recording memory transfers required by an executing application.

FIG. 20 is a flowchart of a process 2000 for recording memory transfers required by an executing application. In operation 2002, a memory of a system hosting an application is divided into micropages (small ranges of memory). A memory map of the application is maintained in operation 2004. The map records which functions (or groups of functions) have valid copies of micropages. In operation 2006, the map is checked to determine which functions have a valid copy of the data when a current function reads for a micropage. Nothing is recorded if the current function has a valid copy of the data. A transfer of the data from another function to the current function is recorded in operation 2008 if the current function does not have a valid copy of the data. The map is updated to reflect that the current function has a valid copy of the micropage in operation 2010 if the data is transferred from another function. A write to a micropage is recorded in operation 2012. In operation 2014, the map is updated to reflect that the current function has the only valid copy of a micropage when a write to the micropage occurs. A report of data transfers among the functions is output in operation 2016.

In one aspect of the present invention, the data is taken as coming from an external source function if no function has a valid copy of the data. The report can be a 2-dimensional table recording data transfers among the functions.

Preferably, an ownership of the micropage is represented by a bitmask, where each bit represents a possible ownership domain. The functions of the application can be partitioned into domains representing hardware and software domains of a target system. Also preferably, external libraries are supported.

A method for advanced profiling according to a preferred embodiment of the present invention is set forth below. This methodology for advanced profiling provides the very useful ability to examine the dynamic data transfers within a C program.

The memory (or more accurately the process space) of the machine hosting the profile is divided into pages in a manner similar to standard memory management techniques. These pages are likely to be somewhat smaller than those typically used by MMUs (e.g. 4 kb), and so for clarity, are referred to herein as micropages, or $\mu$pages.

Each $\mu$page has an ownership associated with it. This can be represented as a bitmask, where each bit represents a possible ownership domain. When no bits are set, the $\mu$page has never been used. When a single bit is set, the corresponding domain holds the only correct copy of the data. When multiple bits are set, multiple domains all hold up-to-date copies of the data in the $\mu$pages.

When the profiled code executes a memory read, the address of the read is converted into a µpage index. If the relevant bit of the µpage is set, no further action is taken. Otherwise, it is considered that the µpage needs to be transferred from one of the other valid ownership domains. A precomputed matrix is used to select the preferred source for the µpage. The cost of this transfer is then counted, and the appropriate bit of the µpage ownership is set (in addition to the existing ownerships, a bitwise-or operation).

When the profiled code executes a memory write the address of the write is converted into a µpage index. If the relevant bit is already set, all other bits must now be cleared, as the write will dirty the µpage. If the relevant bit is not set, the same procedure as for a read are executed, and then the other bits cleared.

This procedure allows the recording of exactly the memory transfers required by the executing application, with the following possible limitations:

The accuracy is limited by the size of the µpages. However, in many target platforms there is often no appreciable difference between transferring one byte or one hundred. So, as long as the granularity is of a similar order to this larger number the accuracy should not be too adversely affected. If the storage requirements of the µpage map get too large, a singly or doubly indirect map can be used.

Functions within the profiled application may need to be partitioned into domains. This can be done automatically through static analysis, or as a user-driven process.

Realated Tools/Add-Ons

Other tools/add-ons provided by embodiments of the present invention include:

A Handel-C "code improver" that applies (or suggesting) transformations to a Handel-C program to improve its area or performance.

A C to Handel-C translator that performs a "first-pass" translation for simple constructs, eliminating some of the initial work when porting a partitioned, executable specification.

An estimation tool capable of interactively evaluating possible partitions.

A lint-like tool for evaluating the "quality" of a piece of-Handel-C, and pointing out possible mistakes made by programmers familiar with C but not with Handel-C.

Interface assistance, particularly when assembling several Handel-C programs built in different clock domains on a single device.

Figure 21:
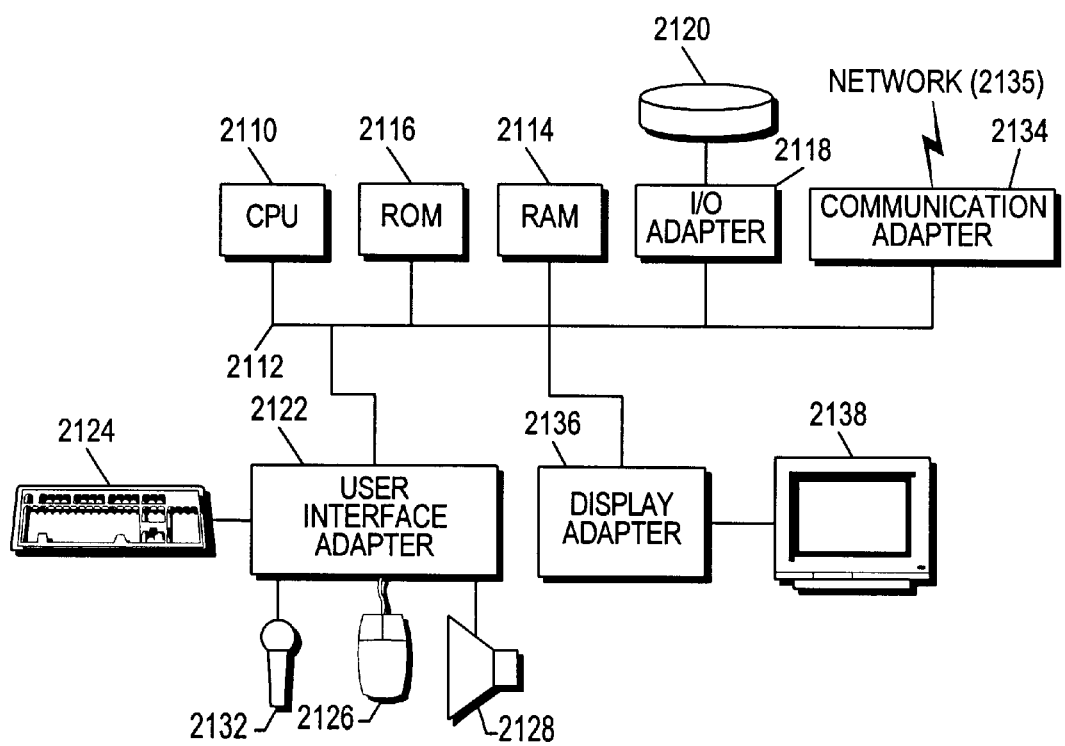
FIG. 21 is a schematic diagram of a hardware implementation of one embodiment of the present invention.

An embodiment of a system in accordance with the present invention may be practiced in the context of a personal computer such as an IBM compatible personal computer, Apple Macintosh computer or UNIX based workstation. A representative hardware environment is depicted in FIG. 21, which illustrates a typical hardware configuration of a workstation in accordance with a preferred embodiment having a central processing unit 2110, such as a microprocessor, and a number of other units interconnected via a system bus 2112. The workstation shown in FIG. 21 includes a Random Access Memory (RAM) 2114, Read Only Memory (ROM) 2116, an I/O adapter 2118 for connecting peripheral devices such as disk storage units 2120 to the bus 2112, a user interface adapter 2122 for connecting a keyboard 2124, a mouse 2126, a speaker 2128, a microphone 2132, and/or other user interface devices such as a touch screen (not shown) to the bus 2112, communication adapter 2134 for connecting the workstation to a communication network (e.g., a data processing network) and a display adapter 2136 for connecting the bus 2112 to a display device 2138. The workstation typically has resident thereon an operating system such as the Microsoft Windows NT or Windows/95 Operating System (OS), the IBM OS/2 operating system, the MAC OS, or UNIX operating system. Those skilled in the art will appreciate that the present invention may also be implemented on platforms and operating systems other than those mentioned.

Figure 22:
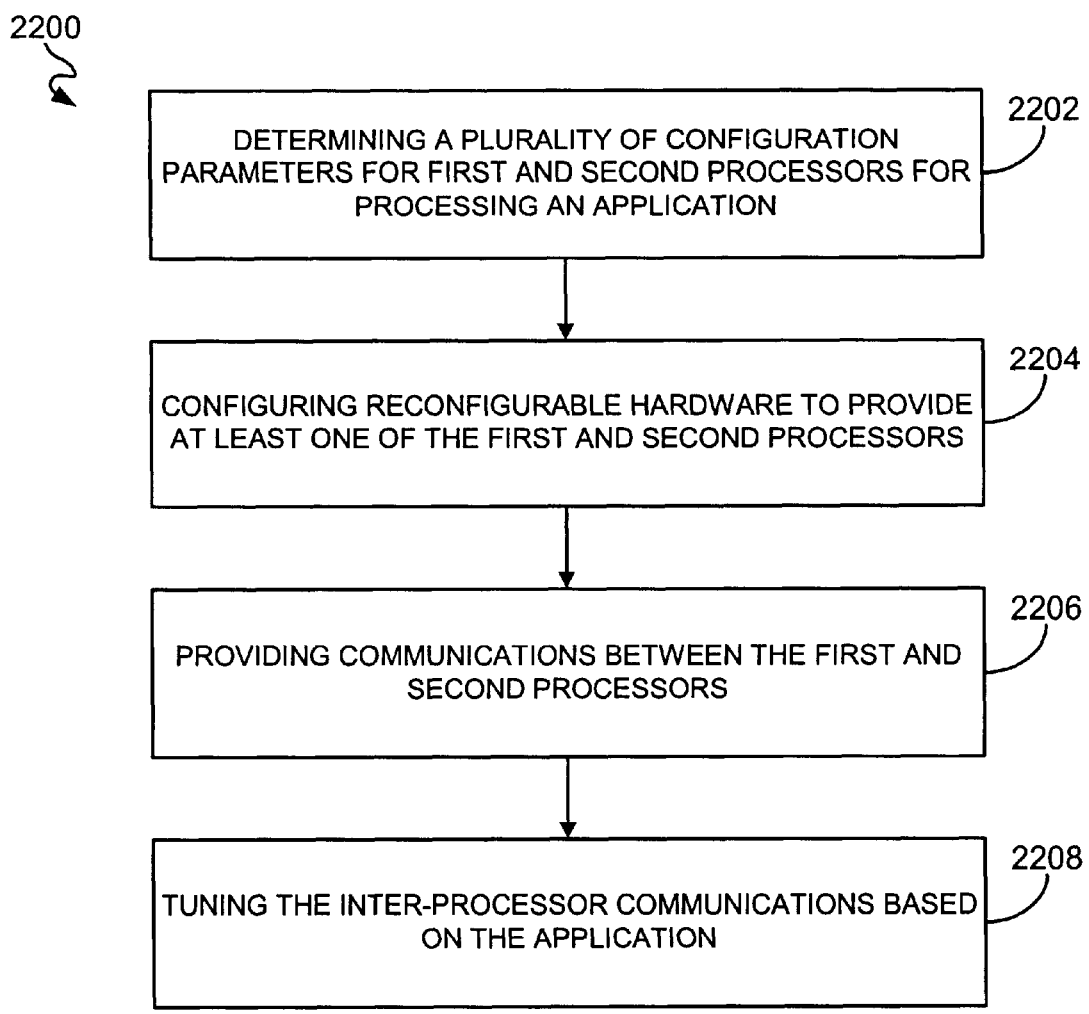
FIG. 22 is a flowchart of a process for providing an application specific multi-processor system in accordance with an embodiment of the present invention.

FIG. 22 is a flowchart of a process 2200 for providing an application specific multi-processor system in accordance with an embodiment of the present invention. A plurality of configuration parameters are determined for first and second processors for processing an application in operation 2202. Reconfigurable hardware is then configured in operation 2204 to provide at least one of the first and second processors such as programming a processor into a portion of an Field Programmable Gate Array (FPGA). An illustrative means by which a processor may be created in an FPGA may be found in U.S. patent application Ser. No. 09/687/481 filed Oct. 12, 2000 entitled "System, method and article of manufacture for emulating a microprocessor in reconfigurable logic" which is incorporated herein by reference. Communications are provided between the first and second processors in operation 2206 so that tuning of the inter-processor communications may occur in operation 2208 based on the application requirements, type of application, speed requirements for the application, etc. Such tuning can include, for example, the bandwidth between hardware and software can be changed to suit the application.

In one aspect of the present invention, the reconfigurable hardware may be a Field Programmable Gate Array. In another aspect, the processors may be of different architectures. In a further aspect, parameters of the at least one of the processors can be tuned. In an embodiment of the present invention, additional functionality may be partitioned between the hardware and software so that the hardware runs in parallel with the processors for meeting speed restraints, for example. Thus time critical parts of the system can be allocated to custom hardware, which can be designed at the behavioral or register transfer level. In an additional aspect, at least one of the processors implemented in the reconfigurable hardware may designed by: defining an instruction width, a width of internal memory and a stack address width; assigning processor opcodes; defining registers; analyzing a processor description input by the user or generated by a codesign system; removing an unused instruction from the processor description, wherein an additional instruction is permitted to be added; and defining the processor based on the processor description.

A preferred embodiment of the present invention utilizes a configurable hardware device such as a Field Programmable Gate Array (FPGA) device. Examples of such FPGA devices include the XC2000™ and XC3000™ families of FPGA devices introduced by Xilinx, Inc. of San Jose, Calif. The architectures of these devices are exemplified in U.S. Pat. Nos. 4,642,487; 4,706,216; 4,713,557; and 4,758,985; each of which is originally assigned to Xilinx, Inc. and which are herein incorporated by reference for all purposes. It should be noted, however, that FPGA's of any type may be employed in the context of the present invention.

Examples of such FPGA devices include the XC2000™ and XC3000™ families of FPGA devices introduced by Xilinx, Inc. of San Jose, Calif. The architectures of these devices are exemplified in U.S. Pat. Nos. 4,642,487; 4,706, 216; 4,713,557; and 4,758,985; each of which is originally assigned to Xilinx, Inc. and which are herein incorporated by reference for all purposes. It should be noted, however, that FPGA's of any type may be employed in the context of the present invention.

An FPGA device can be characterized as an integrated circuit that has four major features as follows.

(1) A user-accessible, configuration-defining memory means, such as SRAM, PROM, EPROM, EEPROM, anti-fused, fused, or other, is provided in the FPGA device so as to be at least once-programmable by device users for defining user-provided configuration instructions. Static Random Access Memory or SRAM is of course, a form of reprogrammable memory that can be differently programmed many times. Electrically Erasable and reprogrammable ROM or EEPROM is an example of nonvolatile reprogrammable memory. The configuration-defining memory of an FPGA device can be formed of mixture of different kinds of memory elements if desired (e.g., SRAM and EEPROM) although this is not a popular approach.

(2) Input/Output Blocks (IOB's) are provided for interconnecting other internal circuit components of the FPGA device with external circuitry. The IOB's' may have fixed configurations or they may be configurable in accordance with user-provided configuration instructions stored in the configuration-defining memory means.

(3) Configurable Logic Blocks (CLB's) are provided for carrying out user-programmed logic functions as defined by user-provided configuration instructions stored in the configuration-defining memory means.

Typically, each of the many CLB's of an FPGA has at least one lookup table (LUT) that is user-configurable to define any desired truth table, —to the extent allowed by the address space of the LUT. Each CLB may have other resources such as LUT input signal pre-processing resources and LUT output signal post-processing resources. Although the term 'CLB' was adopted by early pioneers of FPGA technology, it is not uncommon to see other names being given to the repeated portion of the FPGA that carries out user-programmed logic functions. The term, 'LAB' is used for example in U.S. Pat. No. 5,260,611 to refer to a repeated unit having a 4-input LUT.

(4) An interconnect network is provided for carrying signal traffic within the FPGA device between various CLB's and/or between various IOB's and/or between various IOB's and CLB's. At least part of the interconnect network is typically configurable so as to allow for programmably-defined routing of signals between various CLB's and/or IOB's in accordance with user-defined routing instructions stored in the configuration-defining memory means.

In some instances, FPGA devices may additionally include embedded volatile memory for serving as scratchpad memory for the CLB's or as FIFO or LIFO circuitry. The embedded volatile memory may be fairly sizable and can have 1 million or more storage bits in addition to the storage bits of the device's configuration memory.

Modern FPGA's tend to be fairly complex. They typically offer a large spectrum of user-configurable options with respect to how each of many CLB's should be configured, how each of many interconnect resources should be configured, and/or how each of many IOB's should be configured. This means that there can be thousands or millions of configurable bits that may need to be individually set or cleared during configuration of each FPGA device.

Rather than determining with pencil and paper how each of the configurable resources of an FPGA device should be programmed, it is common practice to employ a computer and appropriate FPGA-configuring software to automatically generate the configuration instruction signals that will be supplied to, and that will ultimately cause an unprogrammed FPGA to implement a specific design. (The configuration instruction signals may also define an initial state for the implemented design, that is, initial set and reset states for embedded flip flops and/or embedded scratchpad memory cells.)

The number of logic bits that are used for defining the configuration instructions of a given FPGA device tends to be fairly large (e.g., 1 Megabits or more) and usually grows with the size and complexity of the target FPGA. Time spent in loading configuration instructions and verifying that the instructions have been correctly loaded can become significant, particularly when such loading is carried out in the field.

For many reasons, it is often desirable to have in-system reprogramming capabilities so that reconfiguration of FPGA's can be carried out in the field.

FPGA devices that have configuration memories of the reprogrammable kind are, at least in theory, 'in-system programmable' (ISP). This means no more than that a possibility exists for changing the configuration instructions within the FPGA device while the FPGA device is 'in-system' because the configuration memory is inherently reprogrammable. The term, 'in-system' as used herein indicates that the FPGA device remains connected to an application-specific printed circuit board or to another form of end-use system during reprogramming. The end-use system is of course, one which contains the FPGA device and for which the FPGA device is to be at least once configured to operate within in accordance with predefined, end-use or 'in the field' application specifications.

The possibility of reconfiguring such inherently reprogrammable FPGA's does not mean that configuration changes can always be made with any end-use system. Nor does it mean that, where in-system reprogramming is possible, that reconfiguration of the FPGA can be made in timely fashion or convenient fashion from the perspective of the end-use system or its users. (Users of the end-use system can be located either locally or remotely relative to the end-use system.)

Although there may be many instances in which it is desirable to alter a pre-existing configuration of an 'in the field' FPGA (with the alteration commands coming either from a remote site or from the local site of the FPGA), there are certain practical considerations that may make such in-system reprogrammability of FPGA's more difficult than first apparent (that is, when conventional techniques for FPGA reconfiguration are followed).

A popular class of FPGA integrated circuits (IC's) relies on volatile memory technologies such as SRAM (static random access memory) for implementing on-chip configuration memory cells. The popularity of such volatile memory technologies is owed primarily to the inherent reprogrammability of the memory over a device lifetime that can include an essentially unlimited number of reprogramming cycles.

There is a price to be paid for these advantageous features, however. The price is the inherent volatility of the configuration data as stored in the FPGA device. Each time power to the FPGA device is shut off, the volatile configuration memory cells lose their configuration data. Other events may also cause corruption or loss of data from volatile memory cells within the FPGA device.

Some form of configuration restoration means is needed to restore the lost data when power is shut off and then re-applied to the FPGA or when another like event calls for configuration restoration (e.g., corruption of state data within scratchpad memory).

The configuration restoration means can take many forms. If the FPGA device resides in a relatively large system that has a magnetic or optical or opto-magnetic form of non-volatile memory (e.g., a hard magnetic disk)—and the latency of powering up such a optical/magnetic device and/or of loading configuration instructions from such an optical/magnetic form of nonvolatile memory can be tolerated—then the optical/magnetic memory device can be used as a nonvolatile configuration restoration means that redundantly stores the configuration data and is used to reload the same into the system's FPGA device(s) during power-up operations (and/or other restoration cycles).

On the other hand, if the FPGA device(s) resides in a relatively small system that does not have such optical/magnetic devices, and/or if the latency of loading configuration memory data from such an optical/magnetic device is not tolerable, then a smaller and/or faster configuration restoration means may be called for.

Many end-use systems such as cable-TV set tops, satellite receiver boxes, and communications switching boxes are constrained by prespecified design limitations on physical size and/or power-up timing and/or security provisions and/or other provisions such that they cannot rely on magnetic or optical technologies (or on network/satellite downloads) for performing configuration restoration. Their designs instead call for a relatively small and fast acting, non-volatile memory device (such as a securely-packaged EPROM IC), for performing the configuration restoration function. The small/fast device is expected to satisfy application-specific criteria such as: (1) being securely retained within the end-use system; (2) being able to store FPGA configuration data during prolonged power outage periods; and (3) being able to quickly and automatically re-load the configuration instructions back into the volatile configuration memory (SRAM) of the FPGA device each time power is turned back on or another event calls for configuration restoration.

The term 'CROP device' will be used herein to refer in a general way to this form of compact, nonvolatile, and fast-acting device that performs 'Configuration-Restoring On Power-up' services for an associated FPGA device.

Unlike its supported, volatilely reprogrammable FPGA device, the corresponding CROP device is not volatile, and it is generally not 'in-system programmable'. Instead, the CROP device is generally of a completely nonprogrammable type such as exemplified by mask-programmed ROM IC's or by once-only programmable, fuse-based PROM IC's. Examples of such CROP devices include a product family that the Xilinx company provides under the designation 'Serial Configuration PROMs' and under the trade name, XC1700D.TM. These serial CROP devices employ one-time programmable PROM (Programmable Read Only Memory) cells for storing configuration instructions in non-volatile fashion.

A preferred embodiment is written using Handel-C. Handel-C is a programming language marketed by Celoxica Limited, 7-8 Milton Park, Abingdon, Oxfordshire, OX14 4RT, United Kingdom. Handel-C is a programming language that enables a software or hardware engineer to target directly FPGAs (Field Programmable Gate Arrays) in a similar fashion to classical microprocessor cross-compiler development tools, without recourse to a Hardware Description Language. Thereby allowing the designer to directly realize the raw real-time computing capability of the FPGA.

Handel-C is designed to enable the compilation of programs into synchronous hardware; it is aimed at compiling high level algorithms directly into gate level hardware.

The Handel-C syntax is based on that of conventional C so programmers familiar with conventional C will recognize almost all the constructs in the Handel-C language.

Sequential programs can be written in Handel-C just as in conventional C but to gain the most benefit in performance from the target hardware its inherent parallelism must be exploited.

Handel-C includes parallel constructs that provide the means for the programmer to exploit this benefit in his applications. The compiler compiles and optimizes Handel-C source code into a file suitable for simulation or a net list which can be placed and routed on a real FPGA.

More information regarding the Handel-C programming language may be found in "EMBEDDED SOLUTIONS Handel-C Language Reference Manual: Version 3," "EMBEDDED SOLUTIONS Handel-C User Manual: Version 3.0," "EMBEDDED SOLUTIONS Handel-C Interfacing to other language code blocks: Version 3.0," each authored by Rachel Ganz, and published by Celoxica Limited in the year of 2001; and "EMBEDDED SOLUTIONS Handel-C Preprocessor Reference Manual: Version 2.1," also authored by Rachel Ganz and published by Embedded Solutions Limited in the year of 2000; and which are each incorporated herein by reference in their entirety. Also, United States Patent Application entitled SYSTEM, METHOD AND ARTICLE OF MANUFACTURE FOR INTERFACE CONSTRUCTS IN A PROGRAMMING LANGUAGE CAPABLE OF PROGRAMMING HARDWARE ARCHITECTURES and assigned to common assignee Celoxica Limited provides more detail about programming hardware using Handel-C and is herein incorporated by reference in its entirety for all purposes.

It should be noted that other programming and hardware description languages can be utilized as well, such as VHDL.

An embodiment of the present invention may also be written using JAVA, C, and the C++ language and utilize object oriented programming methodology. Object oriented programming (OOP) has become increasingly used to develop complex applications. As OOP moves toward the mainstream of software design and development, various software solutions require adaptation to make use of the benefits of OOP. A need exists for these principles of OOP to be applied to a messaging interface of an electronic messaging system such that a set of OOP classes and objects for the messaging interface can be provided.

OOP is a process of developing computer software using objects, including the steps of analyzing the problem, designing the system, and constructing the program. An object is a software package that contains both data and a collection of related structures and procedures. Since it contains both data and a collection of structures and procedures, it can be visualized as a self-sufficient component that does not require other additional structures, procedures or data to perform its specific task. OOP, therefore, views a computer program as a collection of largely autonomous components, called objects, each of which is responsible for a specific task. This concept of packaging data, structures, and procedures together in one component or module is called encapsulation.

In general, OOP components are reusable software modules which present an interface that conforms to an object model and which are accessed at run-time through a component integration architecture. A component integration architecture is a set of architecture mechanisms which allow software modules in different process spaces to utilize each others capabilities or functions. This is generally done by assuming a common component object model on which to build the architecture. It is worthwhile to differentiate between an object and a class of objects at this point. An object is a single instance of the class of objects, which is often just called a class. A class of objects can be viewed as a blueprint, from which many objects can be formed.

OOP allows the programmer to create an object that is a part of another object. For example, the object representing a piston engine is said to have a composition-relationship with the object representing a piston. In reality, a piston engine comprises a piston, valves and many other components; the fact that a piston is an element of a piston engine can be logically and semantically represented in OOP by two objects.

OOP also allows creation of an object that "depends from" another object. If there are two objects, one representing a piston engine and the other representing a piston engine wherein the piston is made of ceramic, then the relationship between the two objects is not that of composition. A ceramic piston engine does not make up a piston engine. Rather it is merely one kind of piston engine that has one more limitation than the piston engine; its piston is made of ceramic. In this case, the object representing the ceramic piston engine is called a derived object, and it inherits all of the aspects of the object representing the piston engine and adds further limitation or detail to it. The object representing the ceramic piston engine "depends from" the object representing the piston engine. The relationship between these objects is called inheritance.

When the object or class representing the ceramic piston engine inherits all of the aspects of the objects representing the piston engine, it inherits the thermal characteristics of a standard piston defined in the piston engine class. However, the ceramic piston engine object overrides these ceramic specific thermal characteristics, which are typically different from those associated with a metal piston. It skips over the original and uses new functions related to ceramic pistons. Different kinds of piston engines have different characteristics, but may have the same underlying functions associated with it (e.g., how many pistons in the engine, ignition sequences, lubrication, etc.). To access each of these functions in any piston engine object, a programmer would call the same functions with the same names, but each type of piston engine may have different/overriding implementations of functions behind the same name. This ability to hide different implementations of a function behind the same name is called polymorphism and it greatly simplifies communication among objects.

With the concepts of composition-relationship, encapsulation, inheritance and polymorphism, an object can represent just about anything in the real world. In fact, one's logical perception of the reality is the only limit on determining the kinds of things that can become objects in object-oriented software. Some typical categories are as follows:

Objects can represent physical objects, such as automobiles in a traffic-flow simulation, electrical components in a circuit-design program, countries in an economics model, or aircraft in an air-traffic-control system.

Objects can represent elements of the computer-user environment such as windows, menus or graphics objects.

An object can represent an inventory, such as a personnel file or a table of the latitudes and longitudes of cities.

An object can represent user-defined data types such as time, angles, and complex numbers, or points on the plane.

With this enormous capability of an object to represent just about any logically separable matters, OOP allows the software developer to design and implement a computer program that is a model of some aspects of reality, whether that reality is a physical entity, a process, a system, or a composition of matter. Since the object can represent anything, the software developer can create an object which can be used as a component in a larger software project in the future.

If 90% of a new OOP software program consists of proven, existing components made from preexisting reusable objects, then only the remaining 10% of the new software project has to be written and tested from scratch. Since 90% already came from an inventory of extensively tested reusable objects, the potential domain from which an error could originate is 10% of the program. As a result, OOP enables software developers to build objects out of other, previously built objects.

This process closely resembles complex machinery being built out of assemblies and sub-assemblies. OOP technology, therefore, makes software engineering more like hardware engineering in that software is built from existing components, which are available to the developer as objects. All this adds up to an improved quality of the software as well as an increased speed of its development.

Programming languages are beginning to fully support the OOP principles, such as encapsulation, inheritance, polymorphism, and composition-relationship. With the advent of the C++ language, many commercial software developers have embraced OOP. C++ is an OOP language that offers a fast, machine-executable code. Furthermore, C++ is suitable for both commercial-application and systems-programming projects. For now, C++ appears to be the most popular choice among many OOP programmers, but there is a host of other OOP languages, such as Smalltalk, Common Lisp Object System (CLOS), and Eiffel. Additionally, OOP capabilities are being added to more traditional popular computer programming languages such as Pascal.

The benefits of object classes can be summarized, as follows:

Objects and their corresponding classes break down complex programming problems into many smaller, simpler problems.

Encapsulation enforces data abstraction through the organization of data into small, independent objects that can communicate with each other. Encapsulation protects the data in an object from accidental damage, but allows other objects to interact with that data by calling the object's member functions and structures.

Subclassing and inheritance make it possible to extend and modify objects through deriving new kinds of objects from the standard classes available in the system. Thus, new capabilities are created without having to start from scratch.

Polymorphism and multiple inheritance make it possible for different programmers to mix and match characteristics of many different classes and create specialized objects that can still work with related objects in predictable ways.

Class hierarchies and containment hierarchies provide a flexible mechanism for modeling real-world objects and the relationships among them.

Libraries of reusable classes are useful in many situations, but they also have some limitations. For example:

Complexity. In a complex system, the class hierarchies for related classes can become extremely confusing, with many dozens or even hundreds of classes.

Flow of control. A program written with the aid of class libraries is still responsible for the flow of control (i.e., it must control the interactions among all the objects created from a particular library). The programmer has to decide which functions to call at what times for which kinds of objects.

Duplication of effort. Although class libraries allow programmers to use and reuse many small pieces of code, each programmer puts those pieces together in a different way. Two different programmers can use the same set of class libraries to write two programs that do exactly the same thing but whose internal structure (i.e., design) may be quite different, depending on hundreds of small decisions each programmer makes along the way. Inevitably, similar pieces of code end up doing similar things in slightly different ways and do not work as well together as they should.

Class libraries are very flexible. As programs grow more complex, more programmers are forced to reinvent basic solutions to basic problems over and over again. A relatively new extension of the class library concept is to have a framework of class libraries. This framework is more complex and consists of significant collections of collaborating classes that capture both the small scale patterns and major mechanisms that implement the common requirements and design in a specific application domain. They were first developed to free application programmers from the chores involved in displaying menus, windows, dialog boxes, and other standard user interface elements for personal computers.

Frameworks also represent a change in the way programmers think about the interaction between the code they write and code written by others. In the early days of procedural programming, the programmer called libraries provided by the operating system to perform certain tasks, but basically the program executed down the page from start to finish, and the programmer was solely responsible for the flow of control. This was appropriate for printing out paychecks, calculating a mathematical table, or solving other problems with a program that executed in just one way.

The development of graphical user interfaces began to turn this procedural programming arrangement inside out. These interfaces allow the user, rather than program logic, to drive the program and decide when certain actions should be performed. Today, most personal computer software accomplishes this by means of an event loop which monitors the mouse, keyboard, and other sources of external events and calls the appropriate parts of the programmer's code according to actions that the user performs. The programmer no longer determines the order in which events occur. Instead, a program is divided into separate pieces that are called at unpredictable times and in an unpredictable order. By relinquishing control in this way to users, the developer creates a program that is much easier to use. Nevertheless, individual pieces of the program written by the developer still call libraries provided by the operating system to accomplish certain tasks, and the programmer must still determine the flow of control within each piece after it's called by the event loop. Application code still "sits on top of" the system.

Even event loop programs require programmers to write a lot of code that should not need to be written separately for every application. The concept of an application framework carries the event loop concept further. Instead of dealing with all the nuts and bolts of constructing basic menus, windows, and dialog boxes and then making these things all work together, programmers using application frameworks start with working application code and basic user interface elements in place. Subsequently, they build from there by replacing some of the generic capabilities of the framework with the specific capabilities of the intended application.

Application frameworks reduce the total amount of code that a programmer has to write from scratch. However, because the framework is really a generic application that displays windows, supports copy and paste, and so on, the programmer can also relinquish control to a greater degree than event loop programs permit. The framework code takes care of almost all event handling and flow of control, and the programmer's code is called only when the framework needs it (e.g., to create or manipulate a proprietary data structure).

A programmer writing a framework program not only relinquishes control to the user (as is also true for event loop programs), but also relinquishes the detailed flow of control within the program to the framework. This approach allows the creation of more complex systems that work together in interesting ways, as opposed to isolated programs, having custom code, being created over and over again for similar problems.

Thus, as is explained above, a framework basically is a collection of cooperating classes that make up a reusable design solution for a given problem domain. It typically includes objects that provide default behavior (e.g., for menus and windows), and programmers use it by inheriting some of that default behavior and overriding other behavior so that the framework calls application code at the appropriate times.

There are three main differences between frameworks and class libraries:

Behavior versus protocol. Class libraries are essentially collections of behaviors that you can call when you want those individual behaviors in your program. A framework, on the other hand, provides not only behavior but also the protocol or set of rules that govern the ways in which behaviors can be combined, including rules for what a programmer is supposed to provide versus what the framework provides.

Call versus override. With a class library, the code the programmer instantiates objects and calls their member functions. It's possible to instantiate and call objects in the same way with a framework (i.e., to treat the framework as a class library), but to take full advantage of a framework's reusable design, a programmer typically writes code that overrides and is called by the framework. The framework manages the flow of control among its objects. Writing a program involves dividing responsibilities among the various pieces of software that are called by the framework rather than specifying how the different pieces should work together.

Implementation versus design. With class libraries, programmers reuse only implementations, whereas with frameworks, they reuse design. A framework embodies the way a family of related programs or pieces of software work. It represents a generic design solution that can be adapted to a variety of specific problems in a given domain. For example, a single framework can embody the way a user interface works, even though two different user interfaces created with the same framework might solve quite different interface problems.

Thus, through the development of frameworks for solutions to various problems and programming tasks, significant reductions in the design and development effort for software can be achieved. A preferred embodiment of the invention utilizes HyperText Markup Language (HTML) to implement documents on the Internet together with a general-purpose secure communication protocol for a transport medium between the client and the server. HTTP or other protocols could be readily substituted for HTML without undue experimentation. Information on these products is available in T. Berners-Lee, D. Connoly, "RFC 1866: Hypertext Markup Language—2.0" (November 1995); and R. Fielding, H, Frystyk, T. Berners-Lee, J. Gettys and J. C. Mogul, "Hypertext Transfer Protocol—HTTP/1.1: HTTP Working Group Internet Draft" (May 2, 1996). HTML is a simple data format used to create hypertext documents that are portable from one platform to another. HTML documents are SGML documents with generic semantics that are appropriate for representing information from a wide range of domains. HTML has been in use by the World-Wide Web global information initiative since 1990. HTML is an application of ISO Standard 8879; 1986 Information Processing Text and Office Systems; Standard Generalized Markup Language (SGML).

To date, Web development tools have been limited in their ability to create dynamic Web applications which span from client to server and interoperate with existing computing resources. Until recently, HTML has been the dominant technology used in development of Web-based solutions. However, HTML has proven to be inadequate in the following areas:

Poor performance;

Restricted user interface capabilities;

Can only produce static Web pages;

Lack of interoperability with existing applications and data; and

Inability to scale.

Sun Microsystems's Java language solves many of the client-side problems by:

Improving performance on the client side;

Enabling the creation of dynamic, real-time Web applications; and

Providing the ability to create a wide variety of user interface components.

With Java, developers can create robust User Interface (UI) components. Custom "widgets" (e.g., real-time stock tickers, animated icons, etc.) can be created, and client-side performance is improved. Unlike HTML, Java supports the notion of client-side validation, offloading appropriate processing onto the client for improved performance. Dynamic, real-time Web pages can be created. Using the above-mentioned custom UI components, dynamic Web pages can also be created.

Sun's Java language has emerged as an industry-recognized language for "programming the Internet." Sun defines Java as: "a simple, object-oriented, distributed, interpreted, robust, secure, architecture-neutral, portable, high-performance, multithreaded, dynamic, buzzword-compliant, general-purpose programming language. Java supports programming for the Internet in the form of platform-independent Java applets." Java applets are small, specialized applications that comply with Sun's Java Application Programming Interface (API) allowing developers to add "interactive content" to Web documents (e.g., simple animations, page adornments, basic games, etc.). Applets execute within a Java-compatible browser (e.g., Netscape Navigator) by copying code from the server to client. From a language standpoint, Java's core feature set is based on C++. Sun's Java literature states that Java is basically, "C++ with extensions from Objective C for more dynamic method resolution."

Another technology that provides similar function to JAVA is provided by Microsoft and ActiveX Technologies, to give developers and Web designers wherewithal to build dynamic content for the Internet and personal computers. ActiveX includes tools for developing animation, 3-D virtual reality, video and other multimedia content. The tools use Internet standards, work on multiple platforms, and are being supported by over 100 companies. The group's building blocks are called ActiveX Controls, small, fast components that enable developers to embed parts of software in hypertext markup language (HTML) pages. ActiveX Controls work with a variety of programming languages including Microsoft Visual C++, Borland Delphi, Microsoft Visual Basic programming system and, in the future, Microsoft's development tool for Java, code named "Jakarta." ActiveX Technologies also includes ActiveX Server Framework, allowing developers to create server applications. One of ordinary skill in the art readily recognizes that ActiveX could be substituted for JAVA without undue experimentation to practice the invention.

While various embodiments have been described above, it should be understood that they have been presented by way of example only, and not limitation. Thus, the breadth and scope of a preferred embodiment should not be limited by any of the above described exemplary embodiments, but should be defined only in accordance with the following claims and their equivalents.

What is claimed is:

1. A method for recording memory transfers required by an executing application, comprising the steps of:

(a) dividing a memory of a system hosting an application into micropages;

(b) maintaining a memory map of the application which records which functions have valid copies of micropages;

(c) checking the map to determine which functions have a valid copy of the data when a current function reads for a micropage;

(d) recording a transfer of the data from another function to the current function if the current function does not have a valid copy of the data;

(e) updating the map to reflect that the current function has a valid copy of the micropage if the data is transferred from another function;

(f) recording a write to a micropage;

(g) updating the map to reflect that the current function has the only valid copy of a micropage when a write to the micropage occurs; and (h) outputting a report of data transfers among the functions.

2. A method as recited in claim 1, wherein the data is taken as coming from an external source function if no function has a valid copy of the data.

3. A method as recited in claim 1, wherein the report is a 2-dimensional table recording data transfers among the functions.

4. A method as recited in claim 1, wherein an ownership of the micropage is represented by a bitmask, wherein each bit represents a possible ownership domain.

5. A method as recited in claim 1, wherein the functions of the application are partitioned into domains representing hardware and software domains of a target system.

6. A method as recited in claim 1, wherein external libraries are supported.

7. A computer program product for recording memory transfers required by an executing application, comprising the steps of:
 (a) computer code for dividing a memory of a system hosting an application into micropages;
 (b) computer code for maintaining a memory map of the application which records which functions have valid copies of micropages;
 (c) computer code for checking the map to determine which functions have a valid copy of the data when a current function reads for a micropage;
 (d) computer code for recording a transfer of the data from another function to the current function if the current function does not have a valid copy of the data;
 (e) computer code for updating the map to reflect that the current function has a valid copy of the micropage if the data is transferred from another function;
 (f) computer code for recording a write to a micropage;
 (g) computer code for updating the map to reflect that the current function has the only valid copy of a micropage when a write to the micropage occurs; and
 (h) computer code for outputting a report of data transfers among the functions.

8. A computer program product as recited in claim 7, wherein the data is taken as coming from an external source function if no function has a valid copy of the data.

9. A computer program product as recited in claim 7, wherein the report is a 2-dimensional table recording data transfers among the functions.

10. A computer program product as recited in claim 7, wherein an ownership of the micropage is represented by a bitmask, wherein each bit represents a possible ownership domain.

11. A computer program product as recited in claim 7, wherein the functions of the application are partitioned into domains representing hardware and software domains of a target system.

12. A computer program product as recited in claim 7, wherein external libraries are supported.

13. A system for recording memory transfers required by an executing application, comprising the steps of:
 (a) logic for dividing a memory of a system hosting an application into micropages;
 (b) logic for maintaining a memory map of the application which records which functions have valid copies of micropages;
 (c) logic for checking the map to determine which functions have a valid copy of the data when a current function reads for a micropage;
 (d) logic for recording a transfer of the data from another function to the current function if the current function does not have a valid copy of the data;
 (e) logic for updating the map to reflect that the current function has a valid copy of the micropage if the data is transferred from another function;
 (f) logic for recording a write to a micropage;
 (g) logic for updating the map to reflect that the current function has the only valid copy of a micropage when a write to the micropage occurs; and
 (h) logic for outputting a report of data transfers among the functions.

14. A system as recited in claim 13, wherein the data is taken as coming from an external source function if no function has a valid copy of the data.

15. A system as recited in claim 13, wherein the report is a 2-dimensional table recording data transfers among the functions.

16. A system as recited in claim 13, wherein an ownership of the micropage is represented by a bitmask, wherein each bit represents a possible ownership domain.

17. A system as recited in claim 13, wherein the functions of the application are partitioned into domains representing hardware and software domains of a target system.

18. A system as recited in claim 13, wherein external libraries are supported.

\* \* \* \* \*